US012787471B2

(12) United States Patent
Kim et al.

(10) Patent No.: US 12,787,471 B2
(45) Date of Patent: Nov. 3, 2026

(54) IMAGE SENSOR INCLUDING A SOURCE FOLLOWER TRANSISTOR HAVING DRAIN REGIONS

(71) Applicant: Samsung Electronics Co., Ltd., Suwon-si (KR)

(72) Inventors: Junghye Kim, Suwon-si (KR); Donghyun Kim, Suwon-si (KR); Sung In Kim, Suwon-si (KR); Kyoungeun Chang, Suwon-si (KR); Jae Ho Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 874 days.

(21) Appl. No.: 18/164,228

(22) Filed: Feb. 3, 2023

(65) Prior Publication Data

US 2023/0352510 A1 Nov. 2, 2023

(30) Foreign Application Priority Data

Apr. 29, 2022 (KR) ........................ 10-2022-0053826

(51) Int. Cl.
*H10F 39/00* (2025.01)
*H10F 39/18* (2025.01)

(52) U.S. Cl.
CPC ......... *H10F 39/807* (2025.01); *H10F 39/182* (2025.01); *H10F 39/802* (2025.01); *H10F 39/8023* (2025.01); *H10F 39/8027* (2025.01); *H10F 39/8053* (2025.01); *H10F 39/8063* (2025.01); *H10F 39/813* (2025.01)

(58) Field of Classification Search
CPC .. H10F 39/182; H10F 39/802; H10F 39/8023; H10F 39/8027; H10F 39/8037; H10F 39/80373; H10F 39/811; H10F 39/813
See application file for complete search history.

(56) References Cited

U.S. PATENT DOCUMENTS 8,188,524 B2 5/2012 Lee
9,653,511 B2 5/2017 Chen et al.
(Continued)

FOREIGN PATENT DOCUMENTS

JP 2011-211120 A 10/2011
KR 10-0826941 B1 5/2008
(Continued)

*Primary Examiner* — Kevin Parendo
(74) *Attorney, Agent, or Firm* — Fish & Richardson P.C.

(57) ABSTRACT

An image sensor includes a pixel separation part in a substrate and configured to separate pixels, the pixels including a first pixel, the pixel separation part including first to fourth sidewalls that at least partially define the first pixel, a first source follower gate electrode on the first pixel and adjacent to the first sidewall and the second sidewall, a first impurity region adjacent to a first corner where the first sidewall and the second sidewall meet, a second impurity region adjacent to a second corner where the second sidewall and the third sidewall meet, and a third impurity region adjacent to a third corner where the first sidewall and the fourth sidewall meet. The first to third impurity regions are adjacent to the first source follower gate electrode. The second impurity region and the third impurity region are electrically connected to each other.

19 Claims, 16 Drawing Sheets

(56) References Cited

U.S. PATENT DOCUMENTS

| | | | | |
|---|---|---|---|---|
| 9,960,201 | B2 | 5/2018 | Lee et al. | |
| 10,608,026 | B2 | 3/2020 | Go et al. | |
| 11,152,404 | B2 | 10/2021 | Wang et al. | |
| 2014/0291796 | A1 * | 10/2014 | Ishii | H10F 39/8023 257/773 |
| 2018/0190695 | A1 | 7/2018 | Jang et al. | |
| 2020/0029047 | A1 | 1/2020 | Jin et al. | |
| 2020/0176500 | A1 * | 6/2020 | Sze | H10F 39/026 |
| 2021/0074747 | A1 | 3/2021 | Takahashi | |
| 2021/0118925 | A1 | 4/2021 | Zang et al. | |
| 2021/0235026 | A1 | 7/2021 | Xu | |
| 2021/0358980 | A1 | 11/2021 | Oh et al. | |

FOREIGN PATENT DOCUMENTS

| | | | |
|---|---|---|---|
| KR | 10-20180080931 | A | 7/2018 |
| KR | 10-20190048308 | A | 5/2019 |
| KR | 10-20200009643 | A | 1/2020 |
| KR | 10-20200066148 | A | 6/2020 |

* cited by examiner

IMAGE SENSOR INCLUDING A SOURCE FOLLOWER TRANSISTOR HAVING DRAIN REGIONS

CROSS-REFERENCE TO RELATED APPLICATIONS

This U.S. non-provisional patent application claims priority under 35 U.S.C. § 119 to Korean Patent Application No. 10-2022-0053826, filed on Apr. 29, 2022, in the Korean Intellectual Property Office, the entire contents of which are hereby incorporated by reference.

BACKGROUND

The inventive concepts relate to image sensors.

An image sensor is a semiconductor device that converts an optical image into an electrical signal. The image sensor may be classified into a charge coupled device (CCD) type and a complementary metal oxide semiconductor (CMOS) type. The CMOS image sensor is abbreviated as CIS. The CIS includes a plurality of two-dimensionally arranged pixels. Each of the pixels includes a photodiode (PD). The photodiode serves to convert incident light into an electrical signal.

SUMMARY

Some example embodiments of the inventive concepts provide an image sensor capable of reducing signal noise.

An electronic device according to some example embodiments of the inventive concepts may include an image sensor may include a pixel separation part in a substrate and configured to separate pixels of a plurality of pixels disposed in a clockwise direction, the plurality of pixels including a first pixel, wherein the pixel separation part includes first to fourth sidewalls that at least partially define the first pixel. The image sensor may further include a first source follower gate electrode on the first pixel and adjacent to the first sidewall and the second sidewall, a first impurity region in the substrate in the first pixel and adjacent to a first corner where the first sidewall and the second sidewall meet, a second impurity region in the substrate in the first pixel and adjacent to a second corner where the second sidewall and the third sidewall meet, and a third impurity region in the substrate in the first pixel and adjacent to a third corner where the first sidewall and the fourth sidewall meet. The first to third impurity regions may be adjacent to the first source follower gate electrode. The second impurity region and the third impurity region may be electrically connected to each other.

An electronic device according to some example embodiments of the inventive concepts may include a pixel separation part in a substrate and configured to separate first to fourth pixels, side ground regions in the substrate adjacent to sidewalls of the pixel separation part in each of the first to fourth pixels and connected to each other to at least partially comprise a single side ground region extending continuously through the first to fourth pixels, and a lower ground region adjacent to a lower surface of the substrate in one of the first to fourth pixels. The lower ground region may be in contact with at least a portion of the side ground regions.

An electronic device according to some example embodiments of the inventive concepts may include a substrate including a first pixel group and a second pixel group adjacent to each other in a first direction, each given pixel group of the first and second pixel groups may include first to fourth pixels arranged in a clockwise direction around a center of the given pixel group, a pixel separation part in the substrate and configured to separate the first to fourth pixels of each pixel group from each other and to separate the first and second pixel groups from each other, first to fourth transfer transistors in each given pixel group of the first and second pixel groups to correspond to separate, respective pixels of the first to fourth pixels in the given pixel group, each of the first to fourth transfer transistors including a transfer gate and a floating diffusion region, and source follower transistors respectively located in at least one of the first to fourth pixels in each of the first and second pixel groups and connected to each other. Each of the source follower transistors may include a source follower gate electrode and one source region and two drain regions adjacent to the source follower gate electrode. The one source region may be adjacent to a center of the source follower gate electrode. A first distance between the two drain regions may be greater than a second distance between one of the two drain regions and the one source region.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
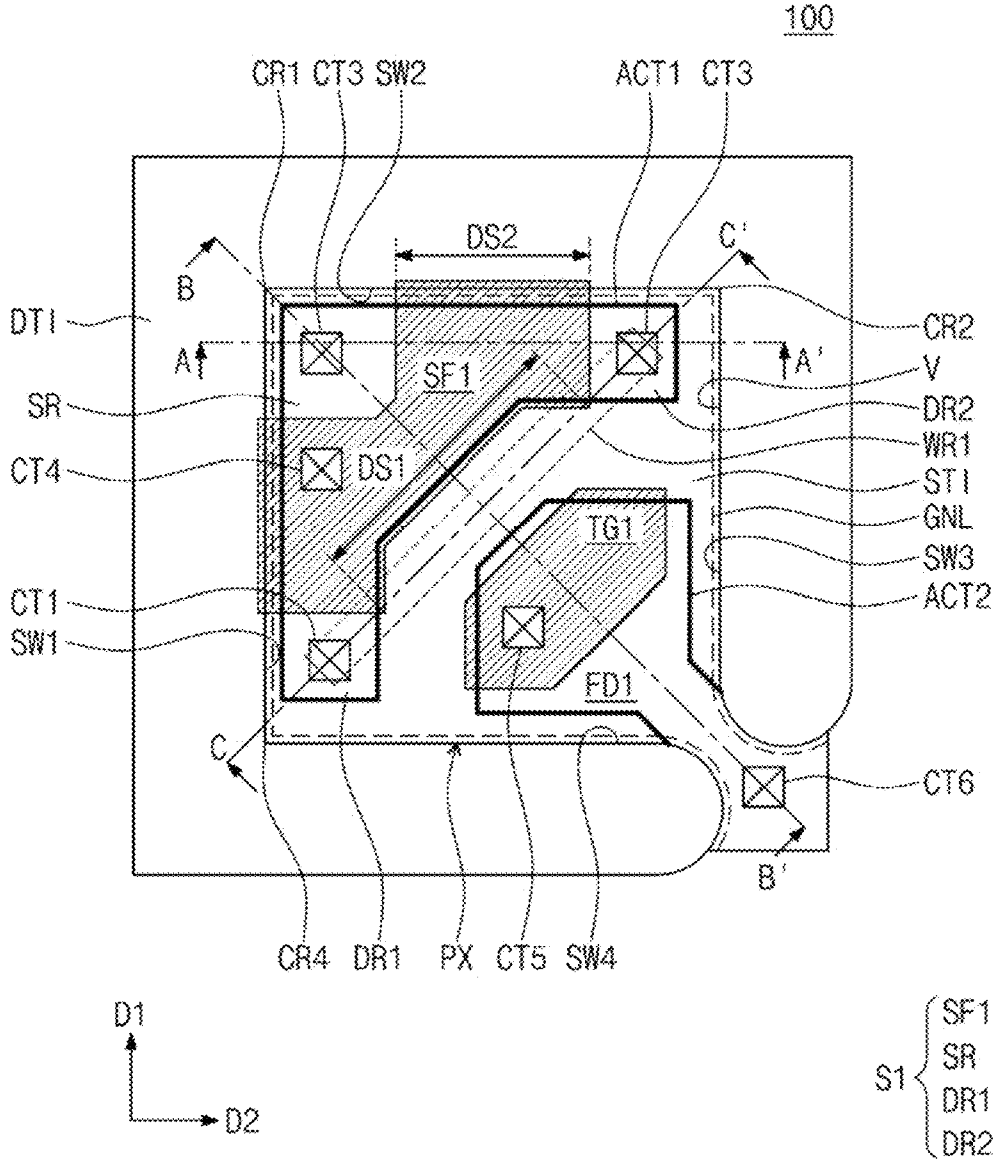
FIG. 1 is a plan view of one pixel of an image sensor according to some example embodiments of the inventive concepts.

Hereinafter, to describe the inventive concepts in more detail, embodiments according to the inventive concepts will be described in more detail with reference to the accompanying drawings. In this specification, terms indicating an order such as first, and second, are used to distinguish components having the same/similar functions as/to each other, and the first and second may be changed depending on an order in which they are mentioned.

It will be understood that when an element is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed "by" performing additional operations, it will be understood that the operation may be performed "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.).

Figure 2A:
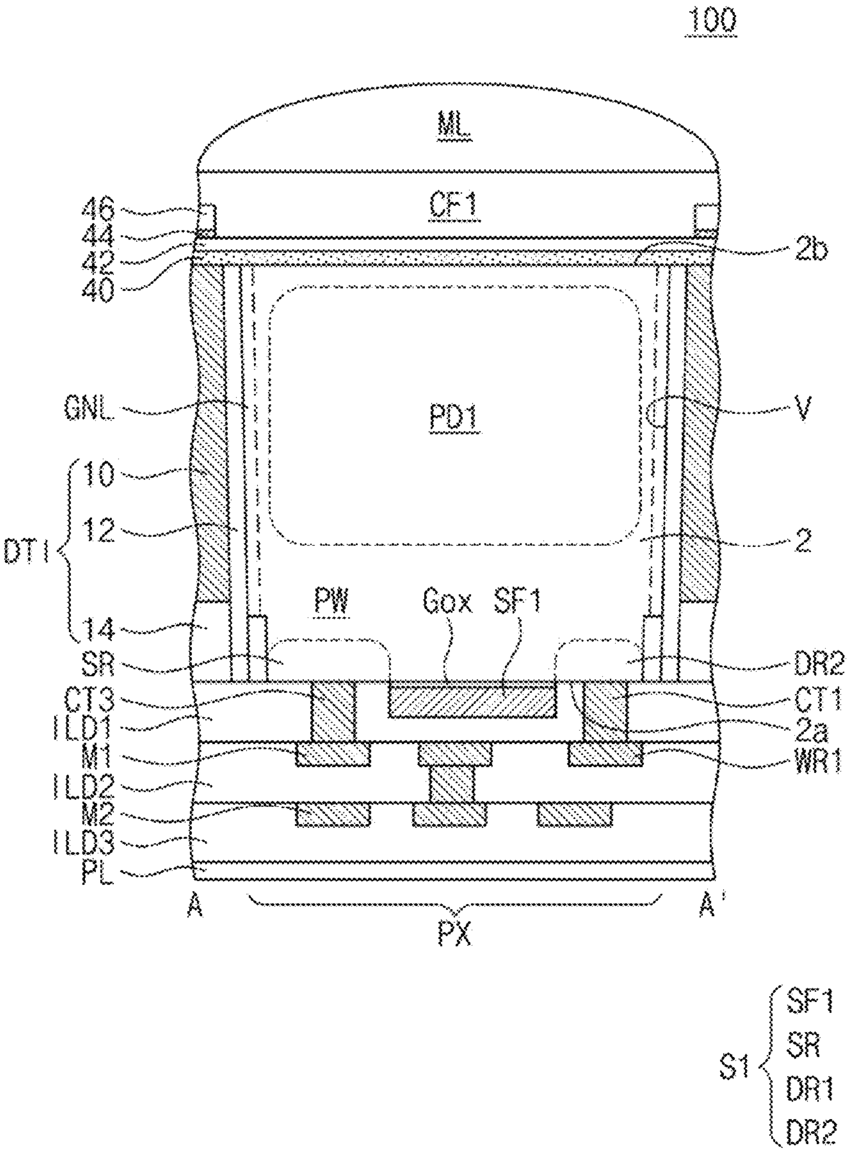
FIGS. 2A, 2B, and 2C are cross-sectional views taken along lines A-A', B-B' and C-C' in FIG. 1, respectively, according to some example embodiments of the inventive concepts.
Figure 2B:
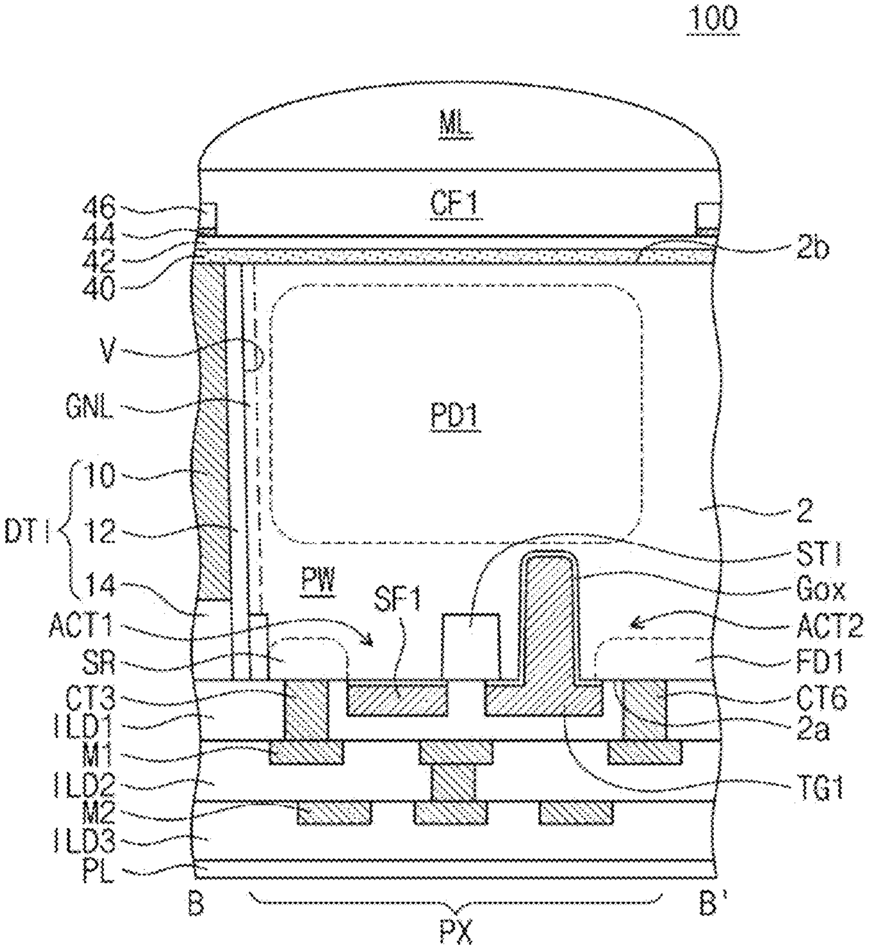
Figure 2C:
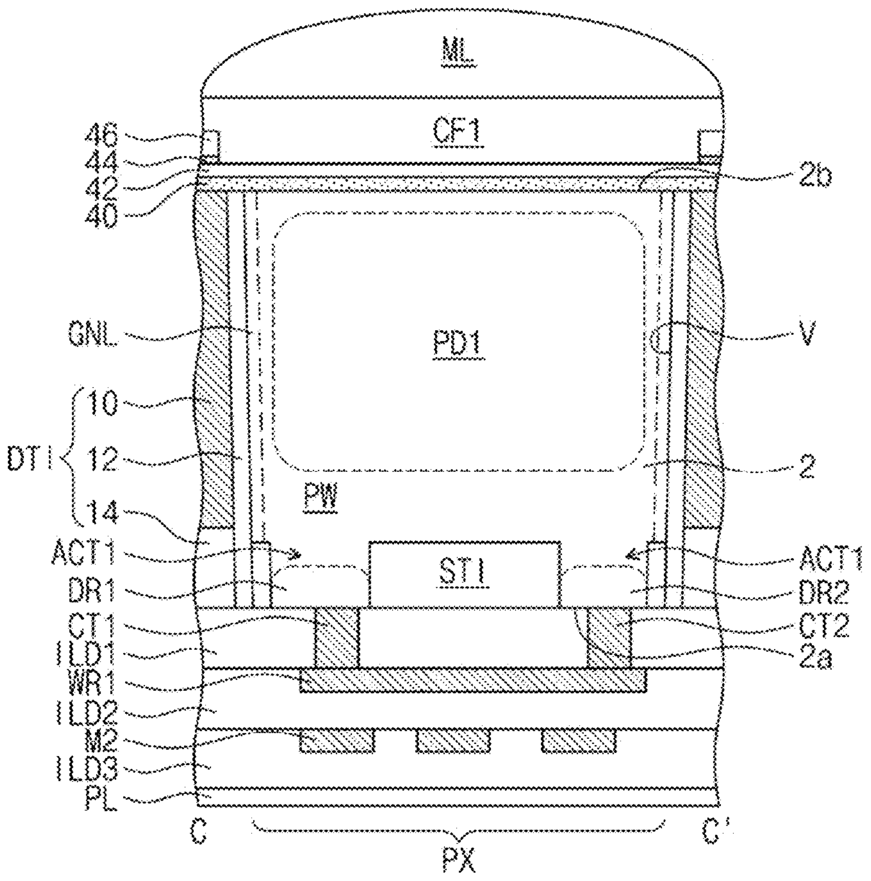
Figure 3:
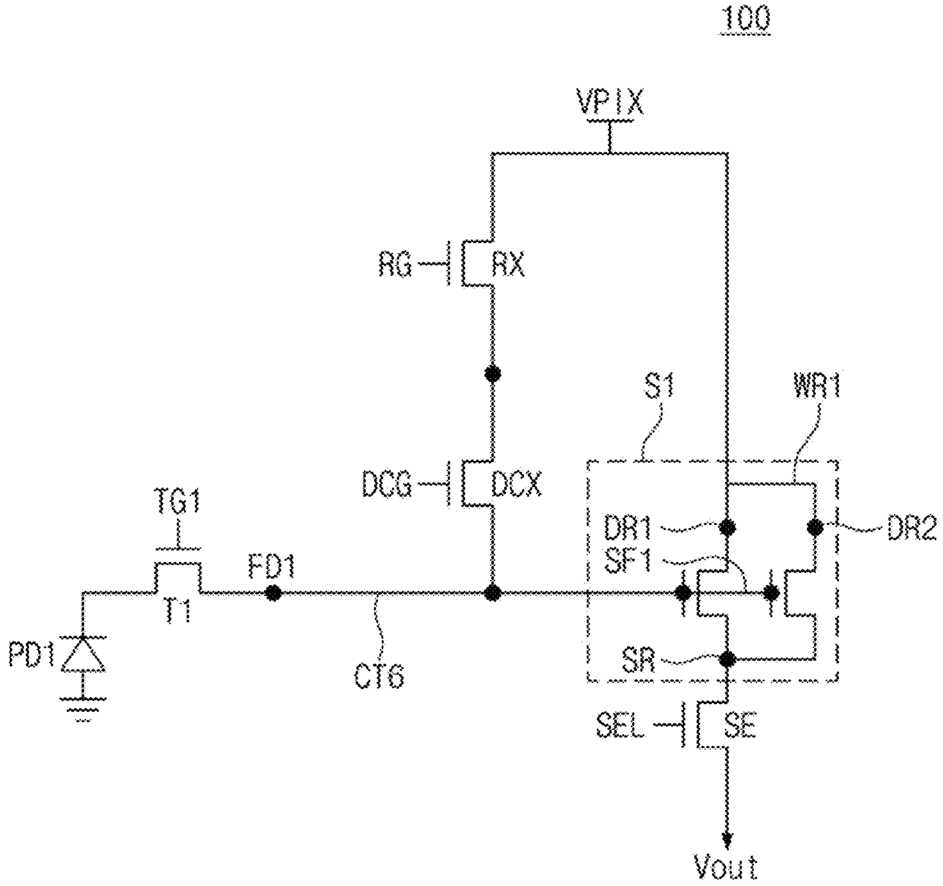
FIG. 3 is a circuit diagram of the image sensor of FIG. 1 according to some example embodiments of the inventive concepts.

FIG. 1 is a plan view of one pixel of an image sensor according to some example embodiments of the inventive concepts. FIGS. 2A to 2C are cross-sectional views taken along lines A-A', B-B', and C-C' of FIG. 1B, respectively. FIG. 3 is a circuit diagram of the image sensor of FIG. 1.

Referring to FIGS. 1 and 2A to 2C, in an image sensor 100 according to the inventive concepts, a substrate 2 is provided. The substrate 2 may include a plurality of pixels PX that are two-dimensionally arranged in a first direction D1 and a second direction D2 crossing each other. In FIG. 1, one pixel PX is illustrated as an example. The substrate 2 may include a first surface 2*a* and a second surface 2*b* opposite to each other. Light may be incident into the substrate 2 through the second surface 2*b*. The substrate 2 may be a single crystal wafer including silicon and/or germanium, an epitaxial layer or a silicon on insulator (SOI) substrate. The substrate 2 may be doped with an impurity of a first conductivity type. The first conductivity type may be, for example, a P-type. The impurity of the first conductivity type may be, for example, boron.

A pixel separation part DTI may be disposed in the substrate 2 and may be configured to separate (e.g., partition, isolate from direct contact, etc.) and define the pixels PX from each other. The pixel separation part DTI may have a mesh shape in a plan view. The pixel separation part DTI may include an isolation conductive pattern 10 spaced apart from (e.g., isolated from direct contact with) the substrate 2. The isolation conductive pattern 10 may include a conductive material having a refractive index different from a refractive index of the substrate 2. The isolation conductive pattern 10 may include, for example, polysilicon doped with impurity or metal. The pixel separation part DTI may further include an isolation insulating pattern 12 interposed between the isolation conductive pattern 10 and the substrate 2. The pixel separation part DTI may further include a buried insulating pattern 14 disposed under the isolation conductive pattern 10. The isolation insulating pattern 12 may be interposed between the buried insulating pattern 14 and the substrate 2. The isolation insulating pattern 12 and the buried insulating pattern 14 may include an insulating material having a refractive index different from a refractive index of the substrate 2. For example, each of the isolation insulating pattern 12 and the buried insulating pattern 14 may include silicon oxide. The pixel separation part DTI may pass through the substrate 2. A width of the pixel separation part DTI may decrease from the first surface 2*a* to the second surface 2*b*.

A negative bias voltage may be applied to the isolation conductive pattern 10. The isolation conductive pattern 10 may serve as a common bias line. Accordingly, holes that capable of existing on a surface of the substrate 2 in contact with the pixel separation part DTI may be trapped, thereby improving dark current characteristics.

Although not shown, the pixel separation part DTI may be formed from the second surface 2*b* to the first surface 2*a*. In this case, the width of the pixel separation part DTI may decrease from the second surface 2*b* to the first surface 2*a*. In addition, the pixel separation part DTI may exclude the isolation conductive pattern 10. In this case, a portion of the fixed charge layer 40 may be extended and interposed between the isolation insulating pattern 12 and the substrate 2.

In one pixel PX, the pixel separation part DTI may have first to fourth sidewalls SW1 to SW4 arranged in a clockwise direction. The first to fourth sidewalls SW1 to SW4 may correspond to an outer sidewall of the isolation insulating pattern 12. In some example embodiments, and as shown in at least FIGS. 1 and 2A-2C, first to fourth sidewalls SW1 to SW4 of the pixel separation part DTI may at least partially define the one pixel PX based on the first to fourth sidewalls SW1 to SW4 of the pixel separation part DTI at least partially defining an interior region V within the pixel PX which may encompass and/or overlap (e.g., vertically overlap in a direction extending perpendicular to the first and/or second surfaces 2*a* and/or 2*b* of the substrate 2) some or all of the elements of the pixel PX. For example, as shown a photoelectric conversion part PD1 may be included in the interior region V. As shown, elements of the pixel PX may be encompassed within the interior region V, such as the first to third impurity regions SR, DR1, and DR2. As shown, elements of the pixel PX may be vertically overlapped with the interior region V, such as the first source follower gate electrode SF1. A first corner CR1 exists where the first and second sidewalls SW1 and SW2 meet. A second corner CR2 exists where the second and third sidewalls SW2 and SW3 meet. A fourth corner CR4 exists where the first and fourth sidewalls SW1 and SW4 meet. In FIG. 1, the third and fourth sidewalls SW3 and SW4 may be spaced apart from each other without meeting each other.

Side ground regions GNL adjacent (e.g., directly adjacent in the horizontal direction that is parallel to the first and/or second surfaces 2*a* and/or 2*b* of the substrate 2) to the first to fourth sidewalls SW1 to SW4 of the pixel separation part DTI may be disposed in the substrate 2. The side ground regions GNL may be in contact with the first to fourth sidewalls SW1 to SW4 of the pixel separation part DTI. The side ground regions GNL may be formed by doping with an impurity of the first conductivity type which is the same as the impurity doped into the substrate 2, and may have a higher doping concentration than a doping concentration of the impurity doped into the substrate 2. For example, the side ground region GNL may be defined as one or more portions of the substrate 2 that further include a dopant impurity of the first conductivity type. Although not shown in FIGS. 1 to 2C, the side ground regions GNL may be connected to a ground line.

In one pixel PX, first and second active regions ACT1 and ACT2 may be disposed on the first surface 2*a* of the substrate 2. The first and second active regions ACT1 and ACT2 may be defined by a device isolation part STI disposed adjacent to the first surface 2*a* in the substrate 2. The device isolation part STI may be formed by a shallow trench isolation (STI) method. The device isolation part STI may be formed in a single-layer or multi-layer structure of at least one of a silicon oxide layer, a silicon nitride layer, and a silicon oxynitride layer. In some example embodiments, the device isolation part STI may be formed by doping the substrate 2 with an impurity of the first conductivity type which is the same as the impurity doped into the substrate 2, and may have a higher doping concentration than the doping concentration of the impurity doped into the substrate 2. The pixel separation part DTI may pass through the device isolation part STI.

The first active region ACT1 may be an active region for a first source follower transistor S1 of FIG. 3. The first active region ACT1 may be adjacent to the first and second sidewalls SW1 and SW2 and the first corner CR1 of the pixel PX. In a plan view of FIG. 1, one sidewall of the first active region ACT1 adjacent to the second active region ACT2 may be depressed toward the first corner CR1.

The first source follower transistor S1 may include a first source follower gate electrode SF1 and first to third impurity regions SR, DR1, and DR2 adjacent (e.g., directly adjacent in the horizontal direction that is parallel to the first and/or second surfaces 2*a* and/or 2*b* of the substrate 2) to the source follower gate electrode SF1. The first source follower gate electrode SF1 is disposed on the first active region ACT1. A portion of the first source follower gate electrode SF1 may be adjacent (e.g., directly adjacent in the horizontal direction that is parallel to the first and/or second surfaces 2*a* and/or 2*b* of the substrate 2) to the first sidewall SW1 or may overlap the first sidewall SW1. Another portion of the first source follower gate electrode SF1 may be adjacent to the second sidewall SW2 or overlap the second sidewall SW2. The first source follower gate electrode SF1 may not overlap the first corner CR1 and may be spaced apart from the first corner CR1.

The first to third impurity regions SR, DR1, and DR2 are disposed in the substrate 2 in the first active region ACT1. The first impurity region SR may be adjacent to a center of the first source follower gate electrode SF1. The first impurity region SR may be adjacent to the first corner CR1. The first impurity region SR may correspond to a source region of the first source follower gate electrode SF1 and may be referred to as a 'source region'. The second and third impurity regions DR1 and DR2 may respectively correspond to drain regions of the first source follower gate electrode SF1 and may be referred to as 'first and second drain regions'. The second and third impurity regions DR1 and DR2 may be electrically connected to each other by a first contact CT1, a second contact CT2, and a drain connection wiring WR1.

In a plan view of FIG. 1, a sidewall of the first source follower gate electrode SF1 adjacent to the first impurity region SR may be depressed in a direction away from the first corner CR1. A first distance DS1 between the second and third impurity regions DR1 and DR2 may be greater than a second distance DS2 between the third impurity region DR2 and the first impurity region SR. The second distance DS2 may correspond to a distance between the second impurity region DR1 and the first impurity region SR.

The second active region ACT2 may be an active region for a first transfer transistor T1. In a plan view, the second active region ACT2 may have a rhombus shape protruding toward the first active region ACT1 between the third and fourth sidewalls SW3 and SW4. A first transfer gate electrode TG1 may be disposed on the second active region ACT2. The first transfer gate electrode TG1 may have a vertical type as shown in FIG. 2B. In detail, a portion of the first transfer gate electrode TG1 may be inserted into the substrate 2. For example, as shown, a portion of the first transfer gate electrode TG1 may be located within a volume space at least partially defined between the outermost surfaces (e.g., first and second surfaces 2*a* and 2*b*) of the substrate 2. In some example embodiments, the first transfer gate electrode TG1 may be of a planar type. A gate insulating layer Gox may be interposed between the first transfer gate electrode TG1 and the substrate 2. The gate insulating layer Gox may include a single layer or multiple layers of at least one of silicon oxide, metal oxide, silicon nitride, and silicon oxynitride.

A first floating diffusion region FD1 may be disposed in the second active region ACT2 next to the first transfer gate electrode TG1. The first floating diffusion region FD1 may be doped with an impurity of a second conductivity type opposite to the impurity of the first conductivity type doped in the substrate 2. For example, the first floating diffusion region FD1 may be doped with phosphorus or arsenic as an N-type impurity. In FIG. 1, the first floating diffusion region FD1 may extend between edges (e.g., respective edges, respective ends, etc.) of the third and fourth sidewalls SW3 and SW4.

A photoelectric conversion part PD1 may be disposed in the substrate 2 in the pixel PX. A well region PW may be disposed between the photoelectric conversion part PD1 and the first surface 2*a*. The well region PW may be doped with, for example, an impurity of the first conductivity type doped into the substrate 2. A concentration of the impurity of the first conductivity type doped in the well region PW may be equal to or greater than the concentration of the impurity doped in the substrate 2. The photoelectric conversion part PD1 may be doped with an impurity of a second conductivity type opposite to the impurity of the first conductivity type. For example, the photoelectric conversion part PD1 may be doped with phosphorus or arsenic as an N-type impurity. The N-type impurity region of the photoelectric conversion part PD1 may form a PN junction with the P-type impurity region of the surrounding substrate 2 and/or the well region PW to form a photodiode. When light is incident, an electron-hole pair may be generated by the PN junction.

Although not shown in FIGS. 1 to 2C, a selection transistor SE, a reset transistor RX, and a dual conversion transistor DCX may be additionally disposed on the first surface 2*a* of the substrate 2.

Referring to FIG. 3, in the image sensor 100 according to some example embodiments, the photoelectric conversion part PD may generate and accumulate electrons (charges) corresponding to incident light, respectively. A voltage level of the first floating diffusion region FD1 may be determined depending on an amount (charge amount) of electrons provided from the first transfer transistors T1. The reset transistor RX may reset the first floating diffusion region FD1. For example, in a state in which the dual conversion transistor DCX is turned on, the reset transistor RX may electrically connect the first floating diffusion region FD1 and a power supply voltage VPIX based on an electrical signal (reset signal) applied to a reset gate electrode RG. The reset transistor RX may be driven using the power supply voltage VPIX as a voltage level of the first floating diffusion region FD1 based on the reset signal, and thus may remove or discharge electrons stored in the first floating diffusion region FD1.

The first source follower transistor S1 may be connected between the power supply voltage VPIX and the selection transistor SE. The first source follower gate electrode SF1 of the first source follower transistor S1 may be connected to the first floating diffusion region FD1. The first source follower transistor S1 may output an output signal Vout to the selection transistor SE based on the voltage level of the first floating diffusion region FD1.

The dual conversion transistor DCX may be connected between the first floating diffusion region FD1 and the reset transistor RX. When the dual conversion transistor DCX is turned off, full well capacity (FWC) of the pixel PX may be capacitance of the first floating diffusion region FD1. When the dual conversion transistor DCX is turned on, the FWC of the pixel PX may become greater than the capacitance of the first floating diffusion region FD1. Conversion gain of the pixel PX may vary depending on on/off of the dual conversion transistor DCX.

The first source follower transistor S1 according to the inventive concepts may have one source region SR and two drain regions DR1 and DR2 disposed next to the first source follower gate electrode SF1. Accordingly, the first source follower transistor S1 may operate as if two source follower transistors are connected in a parallel structure. That is, the first source follower transistor S1 may be of a fingered type. The source follower transistor may be more sensitive to effects of thermal noise and flicker noise inherent in a transistor device than the transfer transistor, the reset transistor, and the select transistor. The noise induced in the source follower transistor is transmitted to an internal circuit as it is, resulting in deterioration of image quality. The source follower transistor may be formed in a fingered type, and thus the effects of thermal noise and flicker noise inherent in the transistor device may be reduced and it may be helpful to fully read potential of the first floating diffusion region FD1. Also, an amount of current may be increased when the first source follower transistor S1 is operated. Accordingly, linearity of a voltage-current graph of the first source follower transistor S1 may be improved, and noise such as random noise and random telegraphy signal may be reduced, thereby configuring the image sensor 100 to sense images with improved performance (e.g., improved quality of sensed images due to reduced noise).

In addition, the first source follower transistor S1 may be disposed adjacent to the first and second sidewalls SW1 and SW2 and the first corner CR1 adjacent to each other, and may have one source region SR and two the drain regions DR1 and DR2, and thus the area of the first source follower gate electrode SF1 may be relatively increased or maximized in a narrow area. Accordingly, an amount of current may be increased during operation of the first source follower transistor S1, and the noise may be reduced, thereby configuring the image sensor 100 to sense images with improved performance. In addition, the number and area of contacts may be reduced compared to a case of manufacturing two source follower transistors having a parallel structure. Therefore, the image sensor may be highly integrated.

In some example embodiments, although the first impurity region SR correspond to the source region of the first source follower transistor S1, and the second and third impurity regions DR1 and DR2 correspond to the drain regions, the first impurity region SR may correspond (be referred) to the drain region of the first source follower transistor S1, and the second and third impurity regions DR1 and DR2 may correspond (be referred) to the source regions of the first source follower transistor S1.

The first source follower transistor S1 according to the inventive concepts may have one source region SR and two drain regions DR1 and DR2 disposed next to the first source follower gate electrode SF1. Accordingly, the first source follower transistor S1 may operate as if two source follower transistors are connected in a parallel structure.

Referring back to FIGS. 2A to 2C, first to third interlayer insulating layers ILD1, ILD2, and ILD3 and a passivation layer PL may be sequentially stacked on the first surface 2*a*. Each of the first to third interlayer insulating layers ILD1, ILD2, and ILD3 may have, for example, a single-layer or multi-layer structure of at least one of silicon oxide, silicon nitride, silicon oxynitride, and a porous insulating material. The passivation layer PL may include, for example, silicon nitride.

First wirings M1 and the drain connection wiring WR1 may be disposed between the first interlayer insulating layer ILD1 and the second interlayer insulating layer ILD2. Second wirings M2 may be disposed between the second interlayer insulating layer ILD2 and the third interlayer insulating layer ILD3. First to sixth contacts CT1 to CT6 passing through the first interlayer insulating layer ILD1 may be disposed on the pixel PX. The first contact CT1 is in contact with the second impurity region DR2. The second contact CT2 is in contact with the third impurity region DR3. The third contact CT3 is in contact with the first impurity region DR1. The fourth contact CT4 is in contact with the first source follower gate electrode SF1. The fifth contact CT5 is in contact with the first transfer gate electrode TG1. The sixth contact CT6 is in contact with the first floating diffusion region FD1. The first wirings M1, the drain connection wiring WR1, the second wirings M2, and the first to sixth contacts CT1 to CT6 may include a conductive material such as a metal.

The fixed charge layer 40 may be disposed on the second surface 2*b* to be in contact with the second surface 2*b*. The fixed charge layer 40 may be in contact with the second surface 2*b*. The fixed charge layer 40 may be formed of a metal oxide layer or a metal fluoride layer including oxygen or fluorine in an amount less than a stoichiometric ratio. Accordingly, the fixed charge layer 40 may have a negative fixed charge. The fixed charge layer 40 may be formed of metal oxide or metal fluoride including at least one metal selected from the group consisting of hafnium (Hf), zirconium (Zr), aluminum (Al), tantalum (Ta), titanium (Ti), yttrium (Y), and lanthanoid. Hole accumulation may occur around the fixed charge layer 40. Accordingly, occurrence of a dark current and a white spot may be effectively reduced. Preferably, the fixed charge layer 40 may be at least one of an aluminum oxide layer and a hafnium oxide layer.

An anti-reflection layer 42 may be disposed on the fixed charge layer 40. The anti-reflection layer 42 may include, for example, silicon nitride. A light blocking pattern 44 and a low refractive index pattern 46 may be sequentially stacked on the anti-reflection layer 42. The light blocking pattern 44 and the low refractive index pattern 46 may have a mesh shape in a plan view, and may overlap the pixel separation part DTI. The light blocking pattern 44 and the low refractive index pattern 46 may expose the anti-reflection layer 42 on the photoelectric conversion part PD. Color filters CF1 may be disposed on the anti-reflection layer 42. Microlenses ML may be disposed on the color filters CF1. Ends of the microlenses ML may be connected to each other while being in contact with each other.

The light blocking pattern 44 may include a material that does not transmit light, such as titanium. A sidewall of the low refractive index pattern 46 may be aligned with a sidewall of the light blocking pattern 44. The light blocking pattern 44 and the low refractive index pattern 46 may reduce or prevent crosstalk between adjacent pixels. The low refractive index pattern 46 may include an organic material. The low refractive index pattern 46 may have a smaller refractive index than a refractive index of the color filter CF1. For example, the low refractive index pattern 46 may have a refractive index of about 1.3 or less.

The color filter CF1 may have a different color for each pixel PX. The color filter CF1 may include a photoresist material to which a dye or a pigment is added. The color filter CF1 may have one color among blue, red, and green.

In some example embodiments, the color filter CF1 may have one color among cyan, yellow, and magenta. The color filter CF1 may be provided in plurality and may be two-dimensionally arranged in the first direction D1 and the second direction D2. The color filters CF1 may be disposed in a Bayer pattern, a 2×2 Tetra pattern, or a 3×3 Nona pattern.

Figure 4:
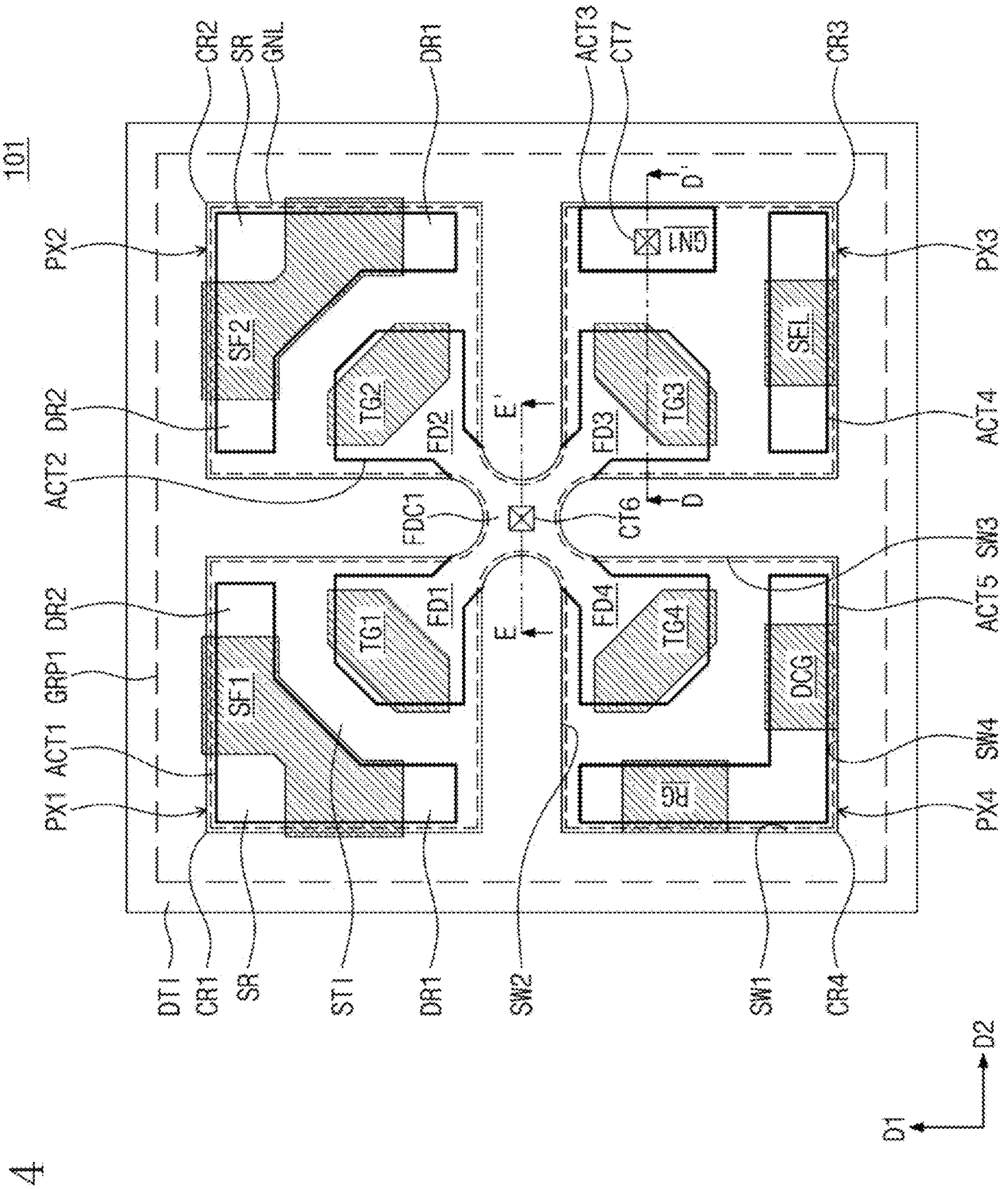
FIG. 4 is a plan view of an image sensor according to some example embodiments of the inventive concepts.
Figure 5A:
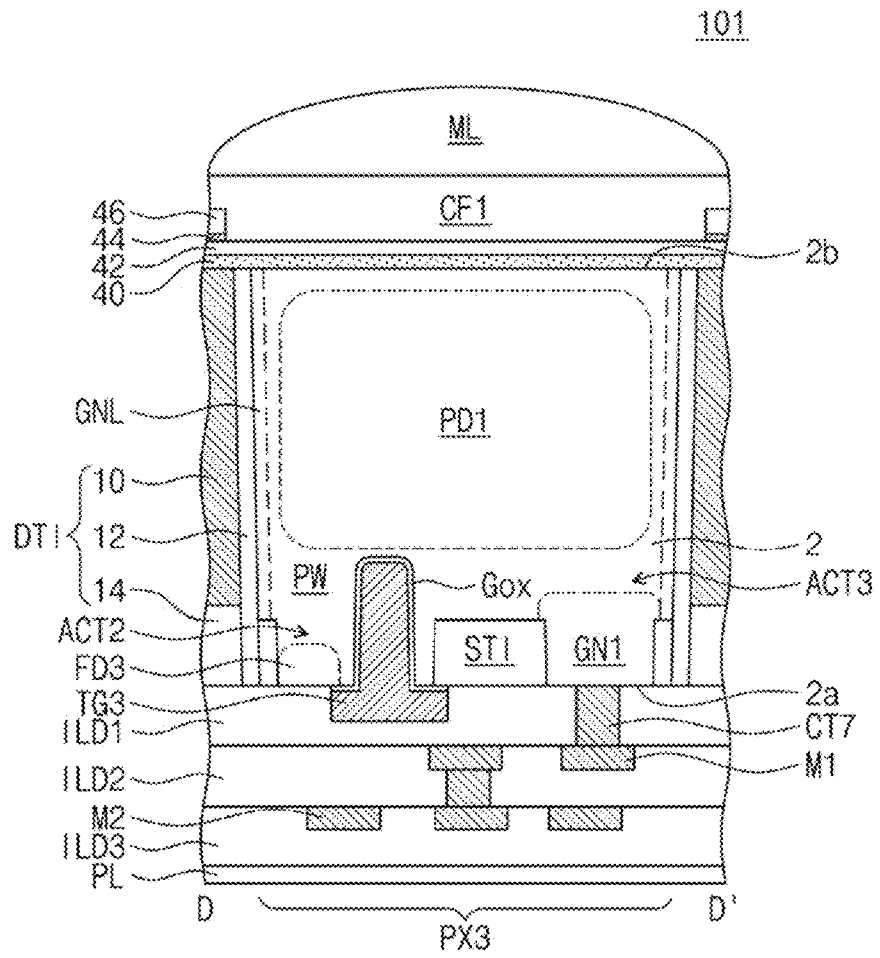
FIG. 5A is a cross-sectional view taken along the line D-D' of FIG. 4 according to some example embodiments of the inventive concepts.
Figure 5B:
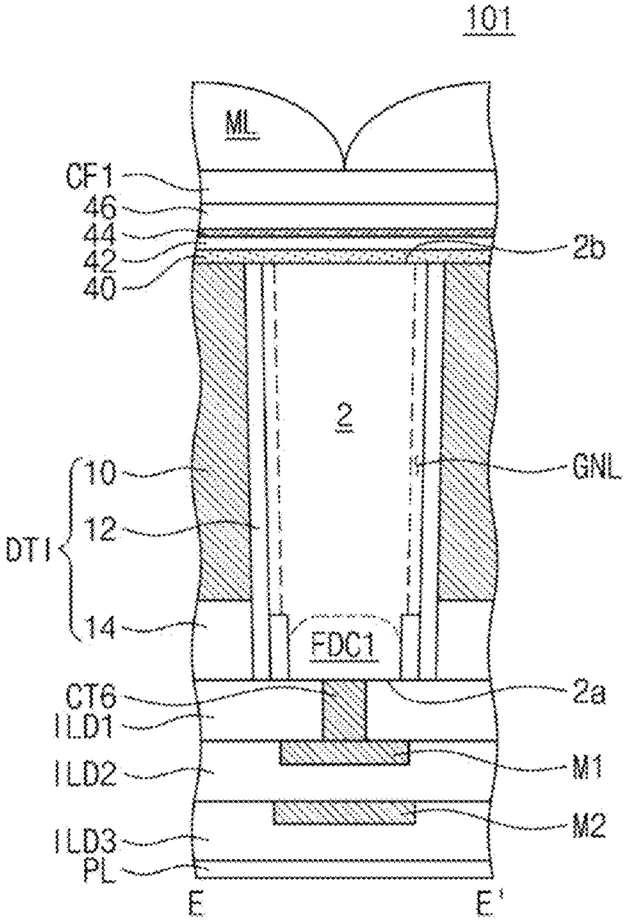
FIG. 5B is a cross-sectional view taken along the line E-E' of FIG. 4 according to some example embodiments of the inventive concepts.
Figure 6:
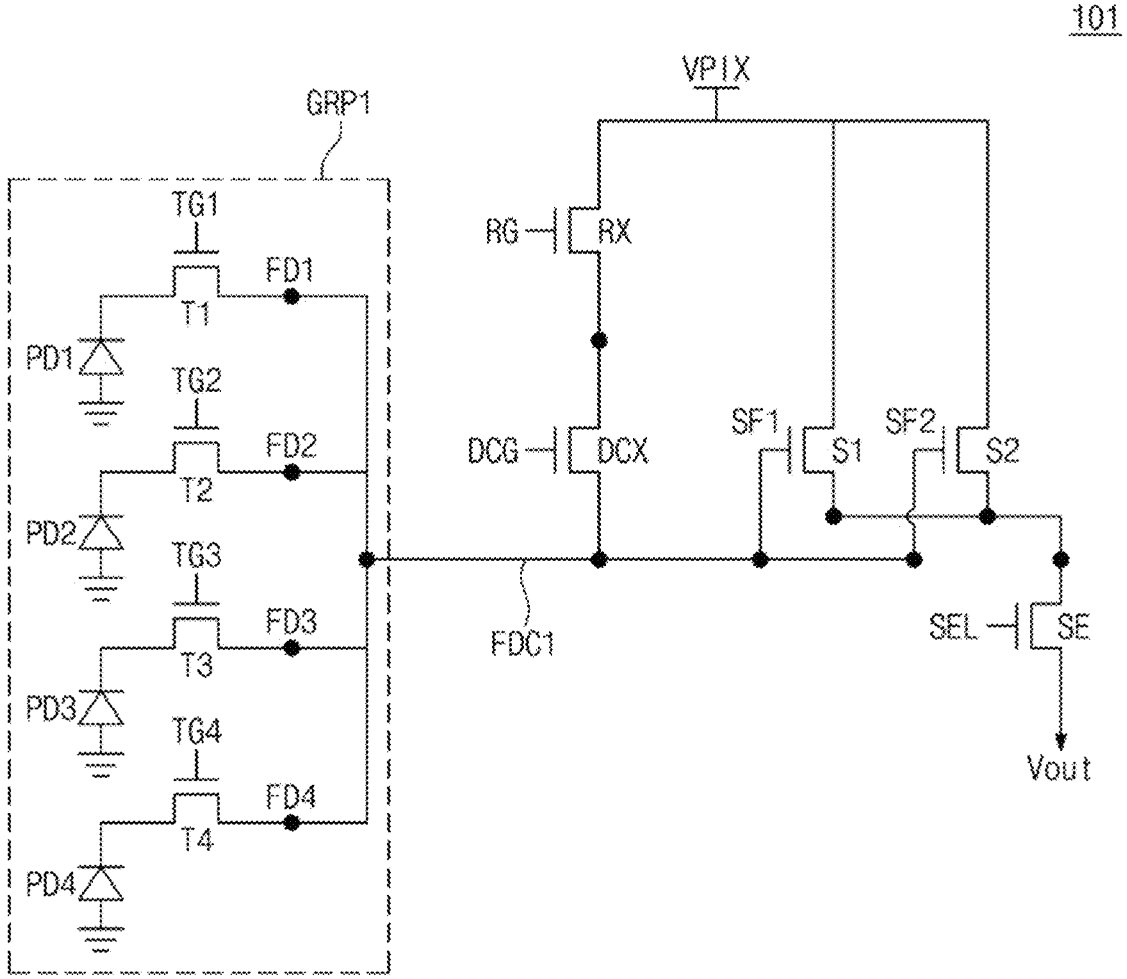
FIG. 6 is a circuit diagram of the image sensor of FIG. 4 according to some example embodiments of the inventive concepts.

FIG. 4 is a plan view of an image sensor according to some example embodiments of the inventive concepts. FIG. 5A is a cross-sectional view taken along the line D-D' of FIG. 4 according to some example embodiments of the inventive concepts. FIG. 5B is a cross-sectional view taken along line E-E' of FIG. 4 according to some example embodiments of the inventive concepts. FIG. 6 is a circuit diagram of the image sensor of FIG. 4.

Referring to FIGS. 4, 5A, 5B and 6, an image sensor 101 according to some example embodiments includes a first pixel group GRP1. The first pixel group GRP1 may include first to fourth pixels PX1 to PX4 arranged in a clockwise direction (e.g., the second to fourth pixels PX2 to PX4 are arranged in a clockwise direction from the first pixel PX1 around a centerpoint at which a sixth contact CT6 is located in FIG. 4). A pixel separation part DTI separates the first to fourth pixels PX1 to PX4 from each other (e.g., partitions and/or isolates the first to fourth pixels PX1 to PX4 from direct contact with each other). A side ground region GNL is disposed adjacent to a side surface of the pixel separation part DTI. The pixel separation part DTI may be absent from a center of the first pixel group GRP1, which includes the centerpoint at which the sixth contact CT6 is located in FIG. 4. The side ground regions GNL disposed in the first to fourth pixels PX1 to PX4 may be connected to each other as illustrated in FIG. 4 to at least partially comprise a single side ground region GNL extending continuously through the first to fourth pixels PX1 to PX4. In a plan view of FIG. 4, an end of the pixel separation part DTI adjacent to the center of the first pixel group GRP1 may be rounded.

Each of the first to fourth pixels PX1 to PX4 may include first to fourth sidewalls SW1 to SW4 arranged in a clockwise direction. Each of the first and second pixels PX1 and PX2 may have a first active region ACT1 and a second active region ACT2 defined by a device isolation part STI.

A first source follower transistor S1 may be disposed on the first active region ACT1 of the first pixel PX1. The first source follower transistor S1 may include a first source follower gate electrode SF1 and first to third impurity regions SR, DR1, and DR2 adjacent to the first source follower gate electrode SF1. The first source follower transistor S1 may be the same as the first source follower transistor S1 described with reference to FIGS. 1 to 3.

A second source follower transistor S2 may be disposed on the first active region ACT1 of the second pixel PX2. The second source follower transistor S2 may include a second source follower gate electrode SF2 and first to third impurity regions SR, DR1 and DR2 adjacent to the second source follower gate electrode SF2. In FIG. 4, the second source follower transistor S2 and the first source follower transistor S1 may be mirror symmetrical. The second source follower gate electrode SF2 and the first source follower gate electrode SF1 may be mirror symmetrical. A portion of the second source follower gate electrode SF2 may be adjacent to the second sidewall SW2 of the second pixel PX2, and the other portion of the second source follower gate electrode SF2 may be adjacent to the third sidewall SW3 of the second pixel PX2. The first impurity region SR of the second pixel PX2 may be adjacent to a second corner CR2 of the second pixel PX2. As described above with reference to FIG. 3, the second source follower transistor S2 may have one source region and two drain regions, and thus may also be a fingered type having a parallel structure.

The third pixel PX3 may have second to fourth active regions ACT2 to ACT4. The third active region ACT3 may be adjacent to the third sidewall SW3 of the third pixel PX3 and may have a bar shape elongated in a first direction D1. A lower ground region GN1 may be disposed in the third active region ACT3. The lower ground region GN1 is disposed adjacent to the first surface 2*a* in the substrate 2. The lower ground region GN1 may be doped with an impurity of the first conductivity type doped into the substrate 2 at a higher doping concentration than a doping concentration of the substrate 2. For example, the lower ground region GN1 may be defined as a portion of the substrate 2 that further includes a dopant impurity of the first conductivity type. The lower ground region GN1 may be in contact with the side ground region GNL as shown in FIG. 5A and thus in contact (e.g., direct contact) with at least a portion of the side ground regions of the first pixel group GRP1. The lower ground region GN1 may be in contact with a seventh contact CT7.

Although the first pixel group GRP1 has four pixels PX1 to PX4, the lower ground region GN1 is not disposed in each of the pixels PX1 to PX4, but is disposed in one pixel PX3. Also, the lower ground region GN1 may be connected to the side ground region GNL, and thus the substrate 2 having the four pixels PX1 to PX4 of the first pixel group GRP1 may be grounded. Accordingly, the lower ground region GN1 may be not disposed in each of the pixels PX1 to PX4, and thus the area occupied by the lower ground region GN1 may be reduced. Therefore, high integration of the image sensor is possible.

The fourth active region ACT4 may be adjacent to the fourth sidewall SW4 of the third pixel PX3 and may have a bar shape elongated in a second direction D2. A selection transistor SE having a selection gate electrode SEL may be disposed on the fourth active region ACT4.

The fourth pixel PX4 may have second and fifth active regions ACT2 and ACT5. The fifth active region ACT5 may be adjacent to the first and fourth sidewalls SW1 and SW4. The fifth active region ACT5 may have an 'L' shape in a plan view, as shown in FIG. 4. A reset transistor RX having a reset gate electrode RG and a dual conversion transistor DCX having a dual conversion gate electrode DCG are arranged side by side on the fifth active region ACT5. The reset gate electrode RG may be adjacent to or overlap the first sidewall SW1 of the fourth pixel PX4. The dual conversion gate electrode DCG may be adjacent to or overlap the fourth sidewall SW4 of the fourth pixel PX4.

The first to fourth pixels PX1 to PX4 may include first to fourth transfer gate electrodes TG1 to TG4 and first to fourth floating diffusion regions FD1 to FD4 disposed in the second active regions ACT2, respectively. The second active regions ACT2 may be disposed adjacent to the center of the first pixel group GRP1. A first common floating diffusion region FDC1 is disposed at the center of the first pixel group GRP1. The first to fourth floating diffusion regions FD1 to FD4 and the first common floating diffusion region FDC1 may have an impurity of a second conductivity type opposite to the impurity of the first conductivity type doped in the substrate 2. For example, the first to fourth floating diffusion regions FD1 to FD4 and the first common floating diffusion region FDC1 may be doped with phosphorus or arsenic as an N-type impurity. The first common floating diffusion region FDC1 is connected to the first to fourth floating diffusion regions FD1 to FD4. A sixth contact CT6 may be disposed on the first common floating diffusion region FDC1.

Transistors disposed in the first pixel group GRP1 of FIG. 4 may be connected as shown in FIG. 6 using first and second wirings M1 and M2 and drain connection wirings WR1. That is, the first to fourth pixels PX1 to PX4 of the first pixel group GRP1 may share the first and second source follower transistors S1 and S2, the reset transistor RX, and the dual conversion transistor DCX, the selection transistor SE with each other. The first and second source follower gate electrodes SF1 and SF2 may be electrically connected to each other by a portion of the first and second wirings M1 and M2. The first impurity regions SR of the first and second pixels PX1 and PX2 may be electrically connected to each other. The second and third impurity regions DR1 and DR2 of the first and second pixels PX1 and PX2 may be electrically connected to each other. The first and second source follower transistors S1 and S2 may be connected in a parallel structure. Accordingly, the noise may be further reduced.

One color filter CF1 may be disposed on the first pixel group GRP1. That is, the first to fourth pixels PX1 to PX4 of the first pixel group GRP1 may be covered with the color filter CF1 of the same color. Convex microlenses ML may be respectively disposed on the first to fourth pixels PX1 to PX4. In some example embodiments, one microlens ML may be disposed on the first pixel group GRP1. In this case, the image sensor 101 may be an auto-focus image sensor.

The image sensor 101 may sequentially apply turn-on voltages to the first to fourth transfer gate electrodes TG1 to TG4, respectively, and charges generated from the first to fourth photoelectric conversion parts PD1 to PD4 may be read sequentially. In some example embodiments, a turn-on voltage to the first to fourth transfer gate electrodes TG1 to TG4 may be simultaneously applied, and charges generated from the first to fourth photoelectric conversion parts PD1 to PD4 may be combined and read simultaneously.

Figure 7:
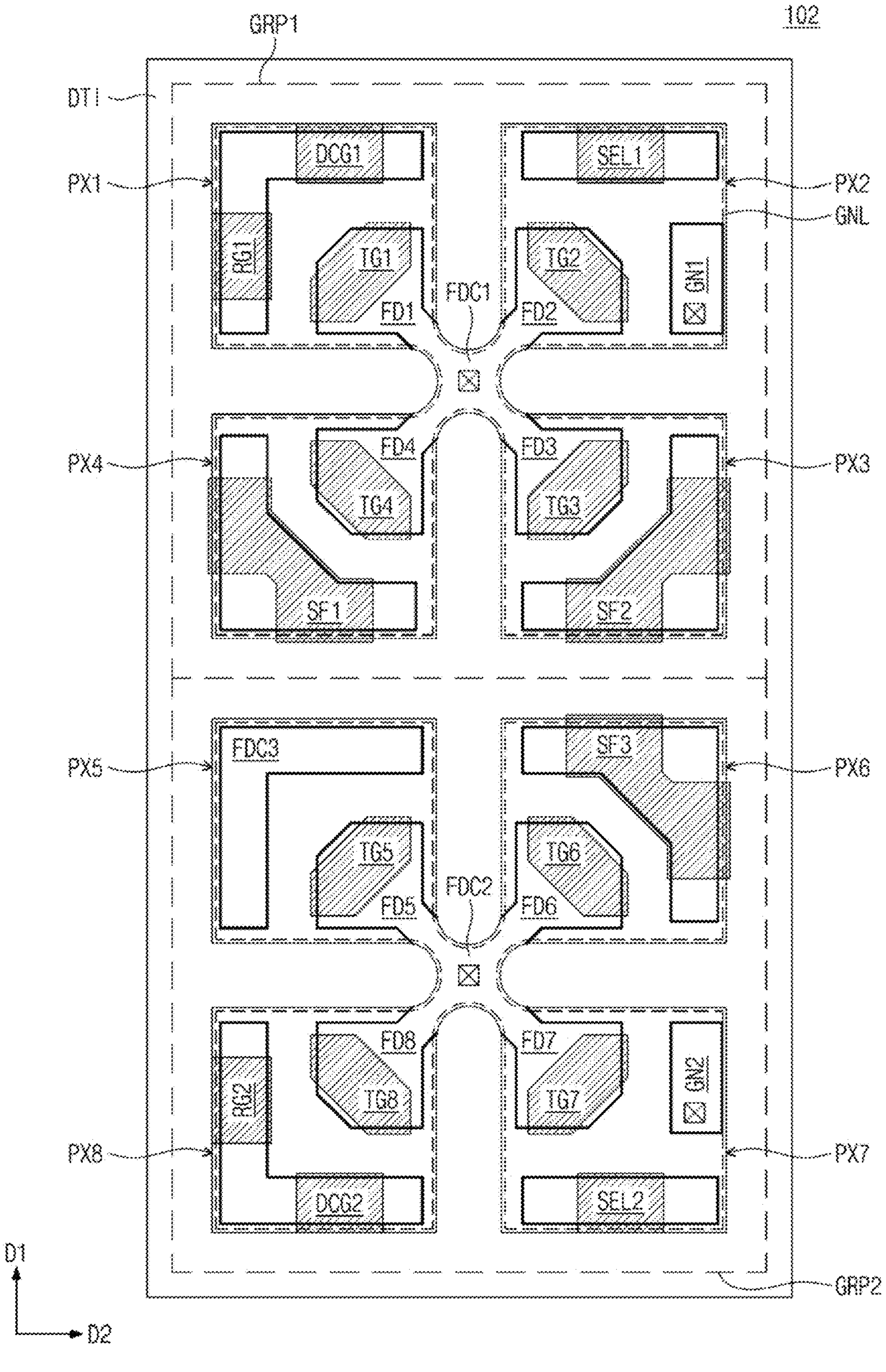
FIG. 7 is a plan view of an image sensor according to some example embodiments of the inventive concepts.
Figure 8:
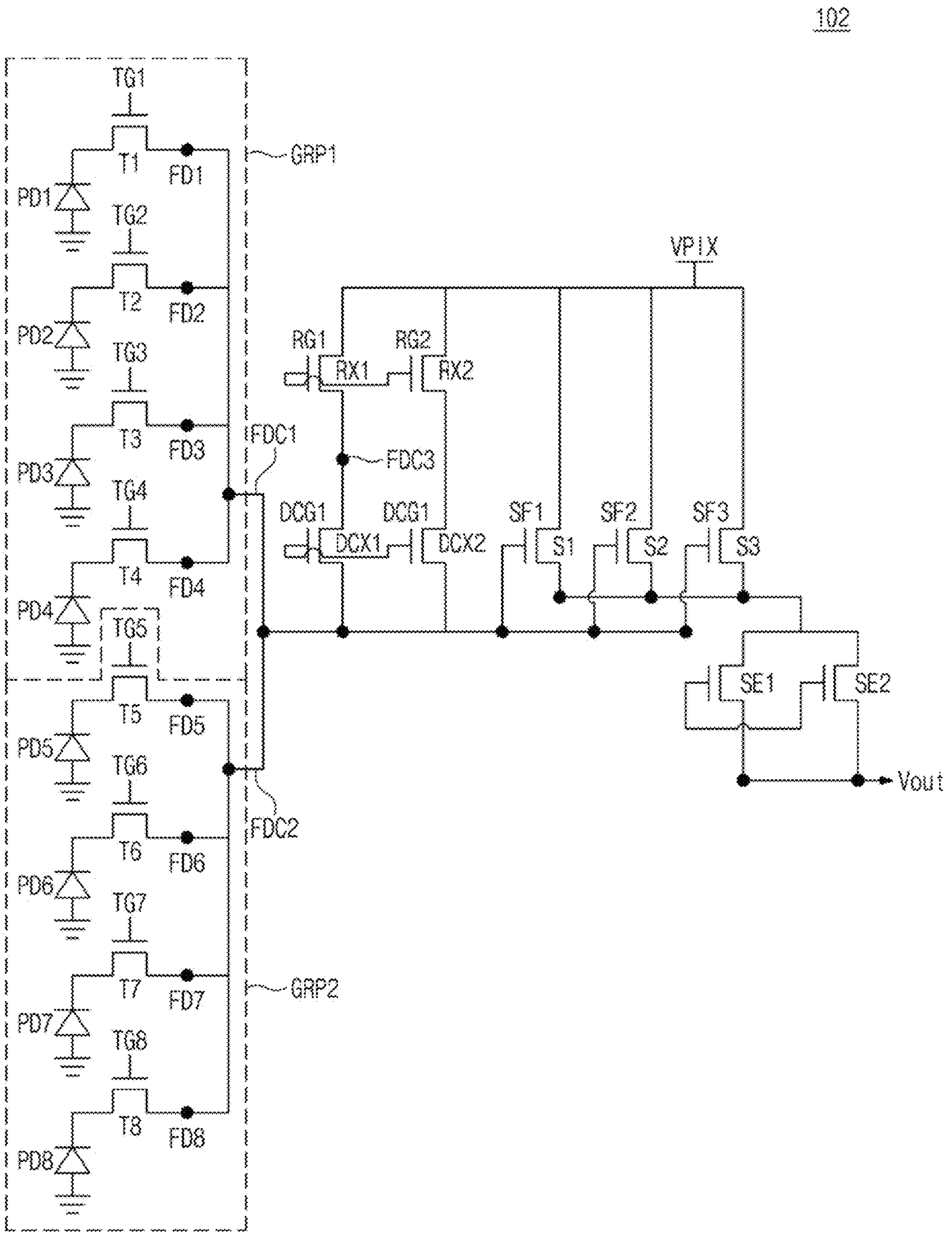
FIG. 8 is a circuit diagram of the image sensor of FIG. 7 according to some example embodiments of the inventive concepts.

FIG. 7 is a plan view of an image sensor according to some example embodiments of the inventive concepts. FIG. 8 is a circuit diagram of the image sensor of FIG. 7.

Referring to FIGS. 7 and 8, an image sensor 102 according to some example embodiments includes a first pixel group GRP1 and a second pixel group GRP2. The second pixel group GRP2 is adjacent to the first pixel group GRP1 in a first direction D1. The first pixel group GRP1 may include first to fourth pixels PX1 to PX4 arranged in a clockwise direction. The second pixel group GRP2 may include fifth to eighth pixels PX5 to PX8 arranged in a clockwise direction.

In the first pixel PX1, a first transfer transistor T1 having a first transfer gate electrode TG1, a first dual conversion transistor DCX1 having a first dual conversion gate electrode DCG1, and a first reset transistor RX1 having a first reset gate electrode RG1 may be disposed.

In the second pixel PX2, a second transfer transistor T2 having a second transfer gate electrode TG2, a first selection transistor SE1 having a first selection gate electrode SEL1, and a first lower ground region GN1 may be disposed. The first lower ground region GN1 may be connected to a side ground region GNL of the first pixel group GRP1. Accordingly, the first to fourth pixels PX1 to PX4 of the first pixel group GRP1 may share the first lower ground region GN1 and may be grounded by the first lower ground region GN1.

In the third pixel PX3, a third transfer transistor T3 having a third transfer gate electrode TG3 and a first source follower transistor S1 having a first source follower gate electrode SF1 may be disposed.

In the fourth pixel PX4, a fourth transfer transistor T4 having a fourth transfer gate electrode TG4 and a second source follower transistor S2 having a second source follower gate electrode SF2 may be disposed.

A first common floating diffusion region FDC1 connected to first to fourth floating diffusion regions FD1 to FD4 is disposed at a center of the first pixel group GRP1.

The fourth pixel PX4 may be adjacent to the fifth pixel PX5 in the first direction D1. The third pixel PX3 may be adjacent to the sixth pixel PX6 in the first direction D1.

In the fifth pixel PX5, a fifth transfer transistor T5 having a fifth transfer gate electrode TG5 and a storage region FDC3 may be disposed. The storage region FDC3 may be a portion of the substrate that is doped with an impurity of a second conductivity type opposite to the impurity of the first conductivity type doped in the substrate 2. For example, the storage region FDC3 may be a portion of the substrate 2 that is doped with phosphorus or arsenic as an N-type impurity. The storage region FDC3 may also be referred to as an 'impurity region'.

In the sixth pixel PX6, a sixth transfer transistor T6 having a sixth transfer gate electrode TG6 and a third source follower transistor S3 having a third source follower gate electrode SF3 may be disposed. The third source follower transistor S3 may be adjacent to the second source follower transistor S2. The third source follower gate electrode SF3 and the second source follower gate electrode SF2 may be mirror symmetrical. The third source follower transistor S3 and the second source follower transistor S2 may be mirror symmetrical.

The first to third source follower transistors S1 to S3 may be disposed adjacent to each other, and thus a length of the first and second wirings M1 and M2 connecting the first to third source follower transistors S1 to S3 may be reduced or minimized. Accordingly, it is possible to reduce or minimize an interference phenomenon such as parasitic capacitance due to neighboring wirings adjacent thereto, thereby reducing noise of an electrical signal.

In the seventh pixel PX7, a seventh transfer transistor T7 having a seventh transfer gate electrode TG7, a second select transistor SE2 having a second select gate electrode SEL2, and a second lower ground region GN2 may be disposed. The second lower ground region GN2 may be connected to the side ground region GNL of the second pixel group GRP2. Accordingly, the fifth to eighth pixels PX5 to PX8 of the second pixel group GRP2 may share the second lower ground region GN2 and may be grounded by the second lower ground region GN2.

In the eighth pixel PX8, an eighth transfer transistor T8 having an eighth transfer gate electrode TG8, a second dual conversion transistor DCX2 having a second dual conversion gate electrode DCG2, and a second reset transistor RX2 having a second reset gate electrode RG2 may be disposed.

The pixel separation part DTI may be absent at the center of the first pixel group GRP1. The pixel separation part DTI may be absent at a center of the second pixel group GRP2. The first common floating diffusion region FDC1 may be disposed at the center of the first pixel group GRP1. A second common floating diffusion region FDC2 may be disposed at the center of the second pixel group GRP2. The second common floating diffusion region FDC2 may be connected to the fifth to eighth floating diffusion regions FD5 to FD8. Some of the first and second wirings M1 and M2 may connect the first common floating diffusion region FDC1 and the second common floating diffusion region FDC2. The fifth to eighth floating diffusion regions FD5 to FD8 and the second common floating diffusion region FDC2 may be doped with an impurity of a second conductivity type opposite to the impurity of the first conductivity type doped in the substrate 2. For example, the fifth to eighth floating diffusion regions FD5 to FD8 and the second common floating diffusion region FDC2 may be doped with phosphorus or arsenic as an N-type impurity.

The transistors disposed in the first and second pixel groups GRP1 and GRP2 may be connected as shown in FIG. 8 using the first and second wirings M1 and M2 and the drain connection wirings WR1. That is, the first to eighth pixels PX1 to PX8 of the first and second pixel groups GRP1 and GRP2 may share the first to third source follower transistors S1 to S3 and the first and second resets transistors RX1 and RX2, the first and second dual conversion transistors DCX1 and DCX2, and the first and second selection transistors SE1 and SE2 with each other. The first and second reset transistors RX1 and RX2 may be connected to each other in a parallel structure. The first and second dual conversion transistors DCX1 and DCX2 may be connected to each other in a parallel structure. The first and second selection transistors SE1 and SE2 may be connected to each other in a parallel structure. Due to the parallel structures, an amount of current may increase when the transistors are operated, and an operation speed may be improved.

The storage region FDC3 may be interposed between the first and second reset transistors RX1 and RX2 and the first and second dual conversion transistors DCX1 and DCX2. Accordingly, the first and second dual conversion transistors DCX1 and DCX2 may be turned on to store a large amount of charges generated at high illuminance in the storage region FDC3 during operation of the image sensor 102. Accordingly, full well capacitance (FWC) of the second pixel group GRP2 and/or the first pixel group GRP1 may be increased at the high luminance.

A color filter CF1 of a first color may be disposed on the first pixel group GRP1. A color filter having a second color different from the first color may be disposed on the second pixel group GRP2.

Figure 9:
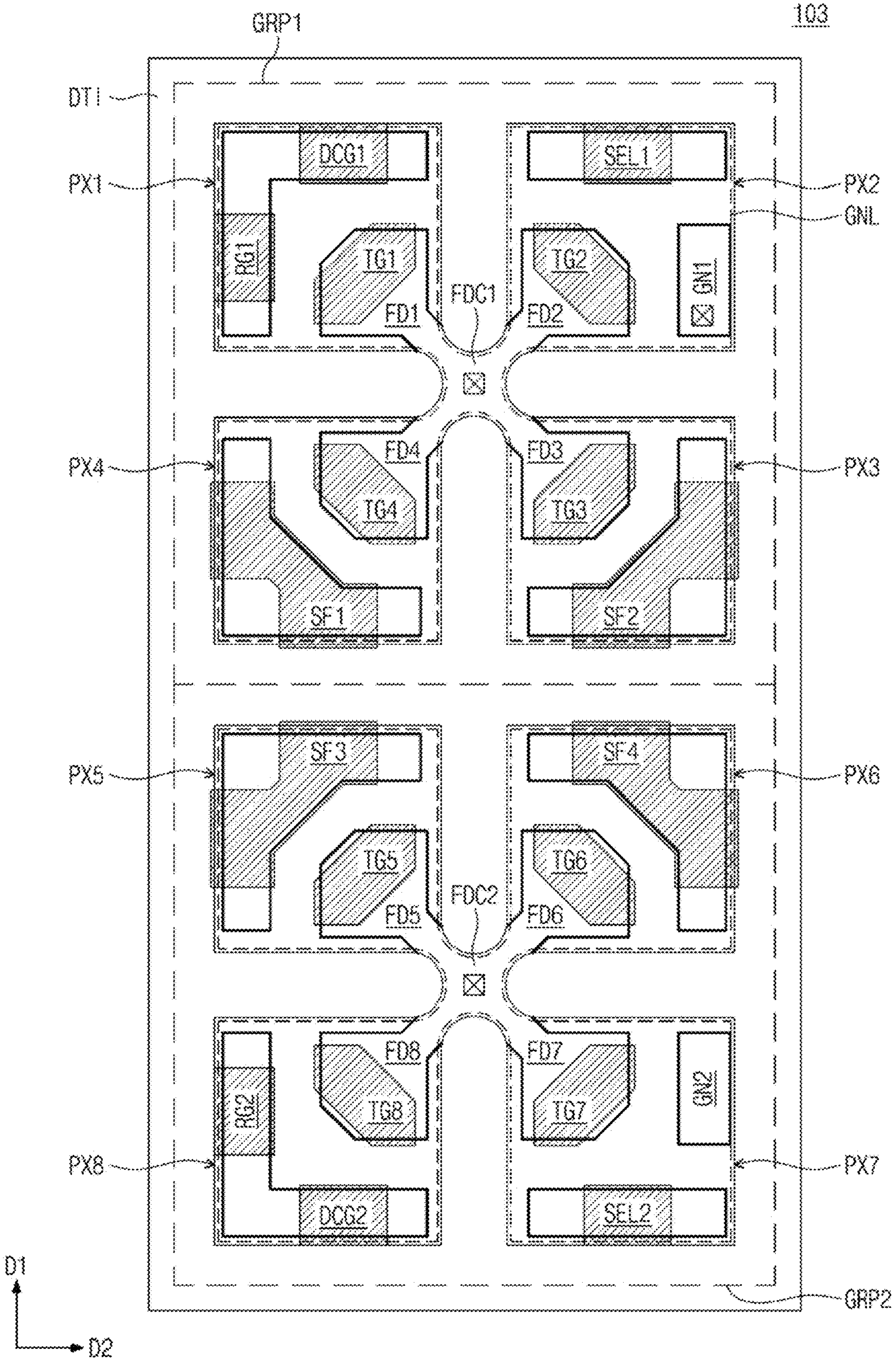
FIG. 9 is a plan view of an image sensor according to some example embodiments of the inventive concepts.
Figure 10:
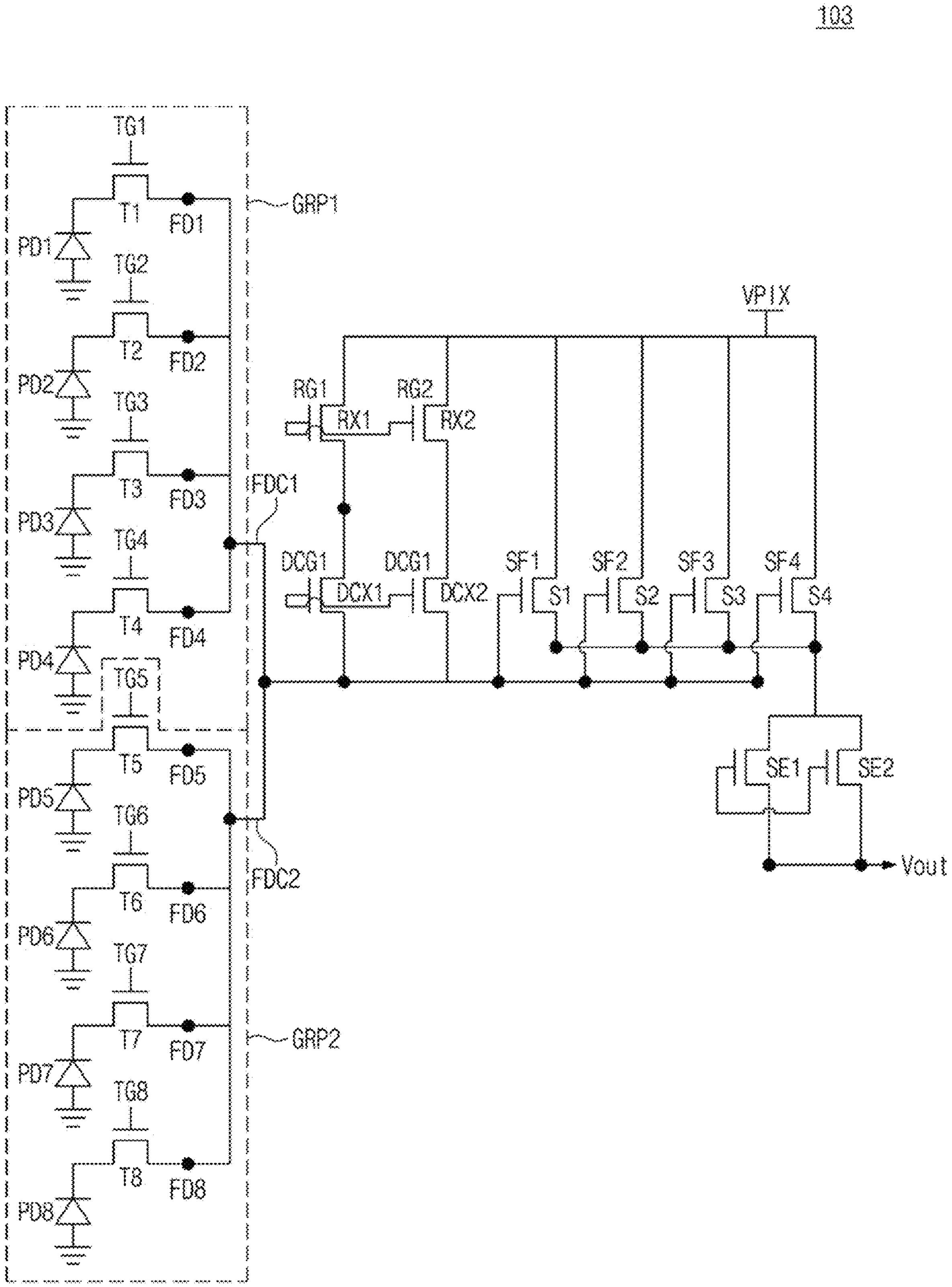
FIG. 10 is a circuit diagram of the image sensor of FIG. 9 according to some example embodiments of the inventive concepts.

FIG. 9 is a plan view of an image sensor according to some example embodiments of the inventive concepts. FIG. 10 is a circuit diagram of the image sensor of FIG. 9.

Referring to FIGS. 9 and 10, in an image sensor 103 according to some example embodiments, a fifth transfer transistor T5 having a fifth transfer gate electrode TG5 and a third source follower transistor S3 having a source follower gate electrode SF3 may be disposed in a fifth pixel PX5. The third source follower transistor S3 may be adjacent to the first source follower transistor S1. The third source follower gate electrode SF3 and the first source follower gate electrode SF1 may be mirror symmetrical. The third source follower transistor S3 and the first source follower transistor S1 may be mirror symmetrical.

In a sixth pixel PX6, a sixth transfer transistor T6 having a sixth transfer gate electrode TG6 and a fourth source follower transistor S4 having a fourth source follower gate electrode SF4 may be disposed. The fourth source follower transistor S4 may be adjacent to the second source follower transistor S2. The fourth source follower gate electrode SF4 and the second source follower gate electrode SF2 may be mirror symmetrical. The fourth source follower transistor S4 and the second source follower transistor S2 may be mirror symmetrical.

The first to fourth source follower transistors S1 to S4 may be disposed adjacent to each other, and thus a length of first and second wirings M1 and M2 connecting the first to fourth source follower transistors S1 to S4 may be reduced or minimized. Accordingly, it is possible to reduce or minimize an interference phenomenon such as parasitic capacitance due to neighboring wirings adjacent thereto, thereby reducing noise of an electrical signal.

The transistors disposed in first and second pixel groups GRP1 and GRP2 may be connected as shown in FIG. 10 using the first and second wirings M1 and M2 and drain connection wirings WR1. That is, first to eighth pixels PX1 to PX8 of the first and second pixel groups GRP1 and GRP2 may share the first to fourth source follower transistors S1 to S4 and first and second reset transistors RX1 and RX2, first and second dual conversion transistors DCX1 and DCX2, and first and second selection transistors SE1 and SE2 with each other. Other structures are the same as those described with reference to FIGS. 7 and 8.

Figure 11:
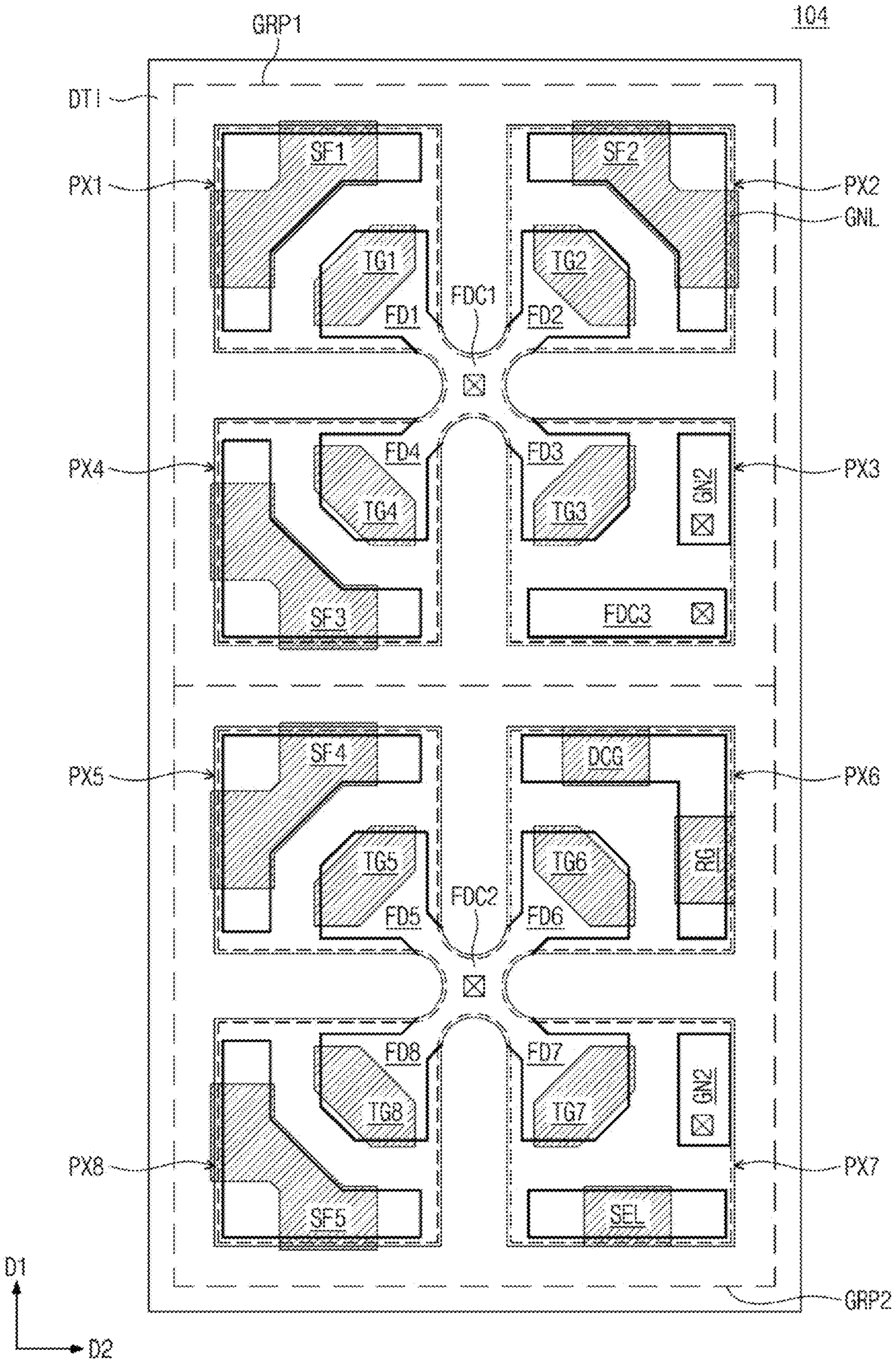
FIG. 11 is a plan view of an image sensor according to some example embodiments of the inventive concepts.
Figure 12:
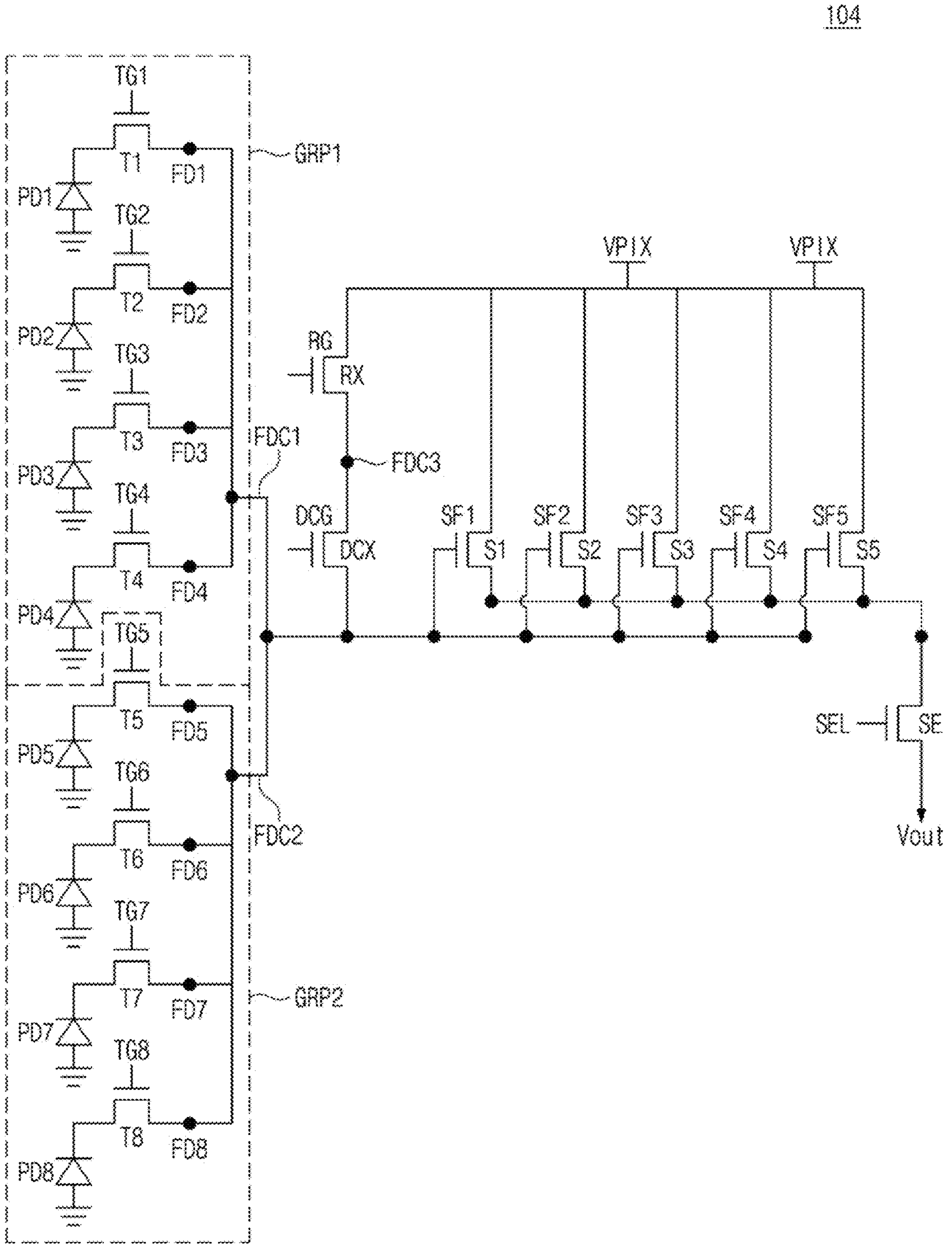
FIG. 12 is a circuit diagram of the image sensor of FIG. 11 according to some example embodiments of the inventive concepts.

FIG. 11 is a plan view of an image sensor according to some example embodiments of the inventive concepts. FIG. 12 is a circuit diagram of the image sensor of FIG. 11.

Referring to FIGS. 11 and 12, in an image sensor 104 according to some example embodiments, a first transfer transistor T1 having a first transfer gate electrode TG1 and a first source follower transistor S1 having a source follower gate electrode SF1 may be disposed in a first pixel PX1.

In a second pixel PX2, a second transfer transistor T2 having a second transfer gate electrode TG2 and a second source follower transistor S2 having a second source follower gate electrode SF2 may be disposed.

In a third pixel PX3, a third transfer transistor T3 having a third transfer gate electrode TG3, a first lower ground region GN1, and a storage region FDC3 may be disposed. The first lower ground region GN1 may be connected to a side ground region GNL of a first pixel group GRP1. Accordingly, the first to fourth pixels PX1 to PX4 of the first pixel group GRP1 may share the first lower ground region GN1 and may be grounded by the first lower ground region GN1.

In the fourth pixel PX4, a fourth transfer transistor T4 having a fourth transfer gate electrode TG4 and a third source follower transistor S3 having a third source follower gate electrode SF3 may be disposed.

In a fifth pixel PX5, a fifth transfer transistor T5 having a fifth transfer gate electrode TG5 and a fourth source follower transistor S4 having a fourth source follower gate electrode SF4 may be disposed.

In a sixth pixel PX6, a sixth transfer transistor T6 having a sixth transfer gate electrode TG6, a dual conversion transistor DCX having a dual conversion gate electrode DCG, and a reset transistor RX having a reset gate electrode RG may be disposed.

In the seventh pixel PX7, a seventh transfer transistor T7 having a seventh transfer gate electrode TG7, a selection transistor SE having a selection gate electrode SEL, and a second lower ground region GN2 may be disposed. The second lower ground region GN2 may be connected to a side ground region GNL of the second pixel group GRP2. Accordingly, the fifth to eighth pixels PX5 to PX8 of the second pixel group GRP2 may share the second lower ground region GN2 and may be grounded by the second lower ground region GN2.

In an eighth pixel PX8, an eighth transfer transistor T8 having an eighth transfer gate electrode TG8 and a fifth source follower transistor S5 having a fifth source follower gate electrode SF5 may be disposed.

The first and second source follower transistors S1 and S2 may be arranged side by side in a second direction D2. The first, third, fourth, and fifth source follower transistors S1, S3, S4, and S5 may be arranged side by side in the first direction D1. As described above, the first to fifth source follower transistors S1 to S5 may be disposed adjacent to each other, and thus a length of first and second wirings M1 and M2 connecting the first to fifth source follower transistors S1 to S5 may be reduced or minimized. Accordingly, it is possible to reduce or minimize an interference phenomenon such as parasitic capacitance due to neighboring wirings adjacent thereto, thereby reducing noise of an electrical signal.

The transistors disposed in the first and second pixel groups GRP1 and GRP2 may be connected as shown in FIG. 12 using the first and second wirings M1 and M2 and drain connection wirings WR1. That is, the first to eighth pixels PX1 to PX8 of the first and second pixel groups GRP1 and GRP2 may share the first to fifth source follower transistors S1 to S5, the reset transistor RX, the dual conversion transistor DCX, and the selection transistor SE1 with each other. Other structures may be the same as those described with reference to FIGS. 9 and 10.

Although the pixel group(s) is illustrated herein as sharing 2 to 5 source follower transistors with each other, the number of source follower transistors is not limited thereto and may be more.

Figure 13:
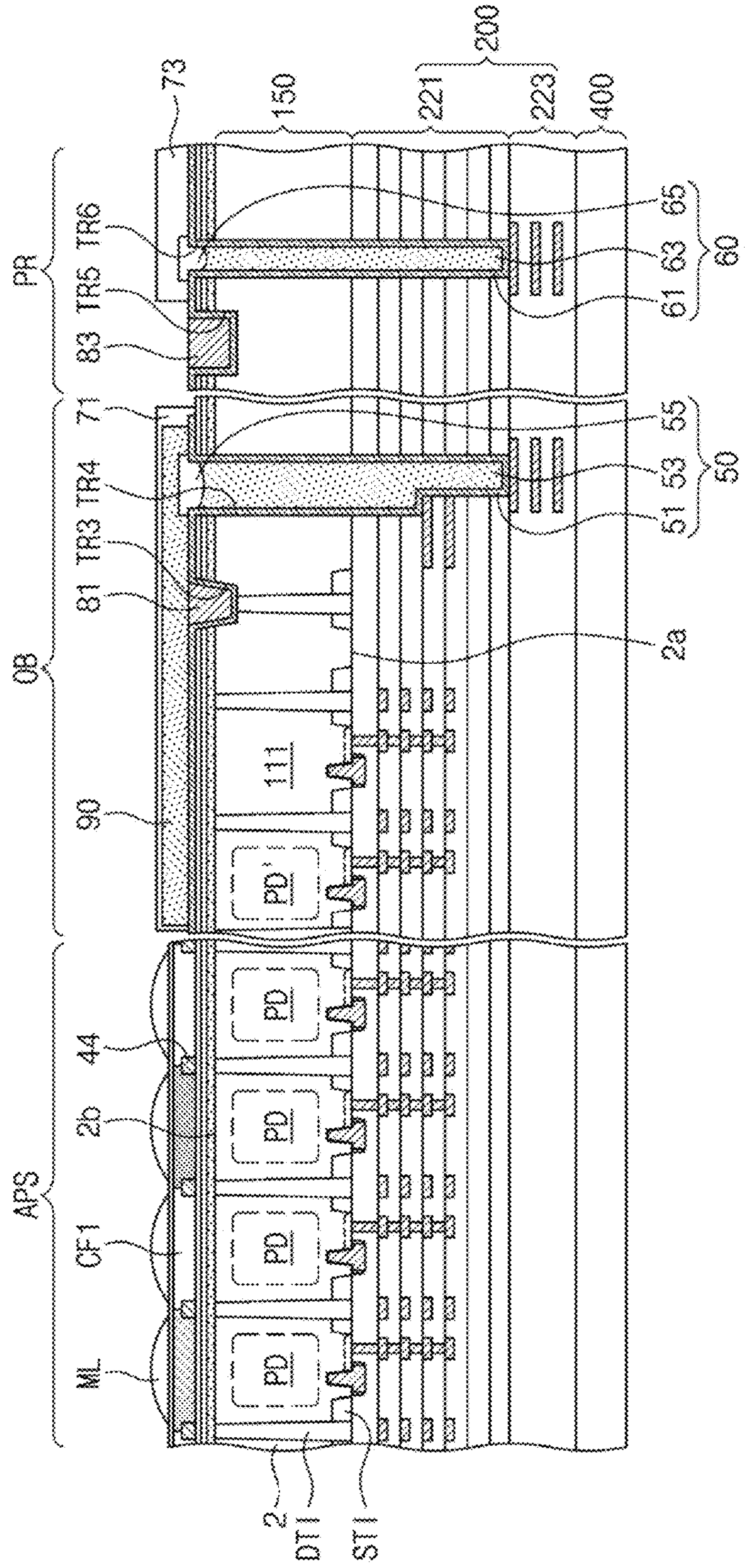
FIG. 13 is a cross-sectional view of an image sensor according to some example embodiments of the inventive concepts.

FIG. 13 is a cross-sectional view of an image sensor according to some example embodiments of the inventive concepts.

Referring to FIG. 13, an image sensor according to some example embodiments of the inventive concepts may include a substrate 2 having a pixel array region APS, an optical black region OB, and a pad region PR, a wiring layer 200 on a first surface 2*a* of the substrate 2, and a base substrate 400 on the wiring layer 200.

The wiring layer 200 may include an upper wiring layer 221 and a lower wiring layer 223. The pixel array area APS may include pixels PX described with reference to FIGS. 1 to 12.

A first connection structure 50, a first conductive pad 81, and a bulk color filter 90 may be provided on the substrate 2 in the optical black region OB. The first connection structure 50 may include a first light blocking pattern 51, an insulating pattern 53, and a first capping pattern 55. The first light blocking pattern 51 may be formed of a conductive material. The first light blocking pattern 51 may include, for example, titanium or tungsten.

The first light blocking pattern 51 may be provided on the second surface 2*b* of the substrate 2. The first light blocking pattern 51 may conformally cover inner walls of a third trench TR3 and a fourth trench TR4. The first light blocking pattern 51 may penetrate a photoelectric conversion layer 150 and the upper wiring layer 221 to connect the photoelectric conversion layer 150 and the wiring layer 200.

The first light blocking pattern 51 may be in contact with an isolation conductive pattern 10 of a pixel separation part DTI of FIG. 2A. The first conductive pad 81 may be electrically connected to the isolation conductive pattern 10 of the pixel separation part DTI of FIG. 2A. The first light blocking pattern 51 may block light incident into the optical black region OB.

The first conductive pad 81 may be provided inside the third trench TR3 to fill the remaining portion of the third trench TR3. The first conductive pad 81 may include a metal material, for example, aluminum. A negative bias voltage may be applied to the isolation conductive pattern 10 through the first conductive pad 81. Accordingly, white spots or dark current problems may be prevented/reduced.

The insulating pattern 53 may fill the remaining portion of the fourth trench TR4. The insulating pattern 53 may penetrate all or part of the photoelectric conversion layer 150 and the wiring layer 200. The first capping pattern 55 may be provided on an upper surface of the insulating pattern 53. The first capping pattern 55 may be provided on the insulating pattern 53.

The bulk color filter 90 may be provided on the first conductive pad 81, the first light blocking pattern 51, and the first capping pattern 55. The bulk color filter 90 may cover the first conductive pad 81, the first light blocking pattern 51, and the first capping pattern 55. A first passivation layer 71 may be provided on the bulk color filter 90 to seal the bulk color filter 90.

A plurality of pixels PX may be disposed in the optical black area OB, and a first reference photoelectric conversion part PD' and a second reference region 111 may be disposed in the pixels PX. The first reference photoelectric conversion part PD' provides a first reference charge amount capable of being generated when light is blocked. The first reference charge amount may be a relative reference value when calculating charge amount generated from the pixels PX. The second reference region 111 provides a second reference charge amount capable of being generated in the absence of a photoelectric conversion part PD. The second reference charge amount may be used as information for removing process noise.

In the pad region PR, a second connection structure 60, a second conductive pad 83, and a second passivation layer 73 may be provided on the substrate 2. The second connection structure 60 may include a second light blocking pattern 61, an insulating pattern 63, and a second capping pattern 65.

The second light blocking pattern 61 may be provided on the second surface 2*b* of the substrate 2. The second light blocking pattern 61 may conformally cover inner walls of a fifth trench TR5 and a sixth trench TR6. The second light blocking pattern 61 may penetrate the photoelectric conversion layer 150 and the upper wiring layer 221 to connect the photoelectric conversion layer 150 and the wiring layer 200. The second light blocking pattern 61 may be in contact with wirings in the lower wiring layer 223. The second light blocking pattern 61 may be electrically connected to wirings in the wiring layer 200. The second light blocking pattern 61 may include a metal material, for example, titanium or tungsten.

The second conductive pad 83 may be provided inside the fifth trench TR5 to fill the remaining portion of the fifth trench TR5. The second conductive pad 83 may include a metal material, for example, aluminum. The second conductive pad 83 may serve as an electrical connection path to the outside of the image sensor. The insulating pattern 63 may fill the remaining portion of the sixth trench TR6. The insulating pattern 63 may penetrate all or part of the photoelectric conversion layer 150 and the wiring layer 200. The second capping pattern 65 may be provided on the insulating pattern 63. The second passivation layer 73 may cover a portion of the second light blocking pattern 61 and the second capping pattern 65.

In the image sensor according to some example embodiments of the inventive concepts, the source follower transistor may have the one source region and two drain regions disposed next to the source follower gate electrode. Accordingly, the one source follower transistor may be operated as if the source follower transistors are connected in the parallel structure. As a result, the noise may be reduced and the highly integrated image sensor may be provided. In addition, the clear image quality may be realized.

In addition, in the image sensor according to some example embodiments of the inventive concepts, the side ground regions disposed on the sidewall of the pixel separation part may be connected to each other and other pixels may be grounded using the lower ground region disposed in the one pixel, thereby reducing the area occupied by the lower ground region. Therefore, the high integration of the image sensor may be realized.

In addition, in the image sensor according to the embodiments of the inventive concepts, the storage region doped with the impurity in the substrate may be connected between the dual conversion transistor and the reset transistor to increase the full well capacitance (FWC) at the high illuminance.

While embodiments are described above, a person skilled in the art may understand that many modifications and variations are made without departing from the spirit and scope of the inventive concepts defined in the following claims. Accordingly, the example embodiments of the inventive concepts should be considered in all respects as illustrative and not restrictive, with the spirit and scope of the inventive concepts being indicated by the appended claims. The embodiments of FIGS. 1 to 13 can be combined with each other.

What is claimed is:

1. An image sensor, comprising:

a pixel separation part in a substrate, the pixel separation part configured to separate pixels of a plurality of pixels disposed in a clockwise direction, the plurality of pixels including a first pixel, wherein the pixel separation part includes first to fourth sidewalls that at least partially define the first pixel; and a source follower transistor including a first source follower gate electrode, a first impurity region, a second impurity region, and a third impurity region;

wherein the first source follower gate electrode is on the first pixel and adjacent to the first sidewall and the second sidewall, wherein the first impurity region is in the substrate in the first pixel and adjacent to a first corner where the first sidewall and the second sidewall meet, wherein the second impurity region is in the substrate in the first pixel and adjacent to a second corner where the second sidewall and the third sidewall meet, wherein the third impurity region is in the substrate in the first pixel and adjacent to a third corner where the first sidewall and the fourth sidewall meet, wherein the first to third impurity regions are adjacent to the first source follower gate electrode, and wherein the second impurity region and the third impurity region are electrically connected to each other.

2. The image sensor of claim 1, wherein the plurality of pixels further include second to fourth pixels arranged in a clockwise direction from the first pixel around a centerpoint, wherein the first to fourth pixels comprise a first pixel group, and wherein the pixel separation part is absent at a center of the first pixel group that includes the centerpoint.

3. The image sensor of claim 2, further comprising:

side ground regions in the substrate adjacent to the first to fourth sidewalls of the pixel separation part in each of the first to fourth pixels and connected to each other to at least partially comprise a single side ground region extending continuously through the first to fourth pixels; and a lower ground region in the substrate adjacent to a lower surface of the substrate in one of the second to fourth pixels, wherein the lower ground region is in contact with at least a portion of the side ground regions.

4. The image sensor of claim 3, further comprising:

a device isolation part in one pixel of the plurality of pixels, the device isolation part defining a first active region and a second active region adjacent to the lower surface of the substrate, the lower ground region in the first active region; and a selection gate electrode on the second active region.

5. The image sensor of claim 2, further comprising:

transfer gate electrodes in separate, respective pixels of the first to fourth pixels, the transfer gate electrodes adjacent to the center of the first pixel group; and a first common floating diffusion region in the substrate at the center of the first pixel group.

6. The image sensor of claim 2, further comprising:

a device isolation part in one of the second to fourth pixels, the device isolation part defining a first active region in the substrate; and a reset gate electrode and a dual conversion gate electrode that are both on the first active region, wherein the first active region has an 'L' shape in a plan view.

7. The image sensor of claim 2, further comprising:

a second pixel group adjacent to the first pixel group, the second pixel group and including fifth to eighth pixels arranged in a clockwise direction around a center of the second pixel group;

a second source follower gate electrode in at least one of the second to eighth pixels; and fourth to sixth impurity regions adjacent to the second source follower gate electrode and spaced apart from each other in the substrate, wherein the fifth and sixth impurity regions are electrically connected to each other.

8. The image sensor of claim 7, wherein the first source follower gate electrode and the second source follower gate electrode are electrically connected to each other.

9. The image sensor of claim 2, further comprising:

a second source follower gate electrode in one of the second to fourth pixels; and fourth to sixth impurity regions adjacent to the second source follower gate electrode and spaced apart from each other in the substrate, wherein the fifth and sixth impurity regions are electrically connected to each other.

10. The image sensor of claim 2, further comprising a storage region in the substrate in one of the second to fourth pixels, wherein the storage region is configured to connect a dual conversion transistor to a reset transistor.

11. The image sensor of claim 1, wherein a first distance between the second impurity region and the third impurity region is greater than a second distance between the first impurity region and the second impurity region.

12. The image sensor of claim 1, wherein the pixel separation part includes:

a conductive isolation pattern in the substrate;

an insulating isolation pattern between the conductive isolation pattern and the substrate; and a buried insulating pattern under the conductive isolation pattern.

13. The image sensor of claim 1, wherein the substrate includes a first surface and a second surface opposite to each other, the first source follower gate electrode is on the first surface of the substrate, and the image sensor further includes:

an interlayer insulating layer covering the first surface, a fixed charge layer in contact with the second surface,
a color filter on the fixed charge layer, and
a microlens on the color filter.

14. The image sensor of claim 1, further comprising:
a first transfer gate electrode on the substrate in the first pixel and spaced apart from the first source follower gate electrode; and
a first floating diffusion region in the substrate at one side of the first transfer gate electrode,
wherein a portion of the first transfer gate electrode is inserted into the substrate.

15. The image sensor of claim 14, wherein the first floating diffusion region is between respective ends of the third and fourth sidewalls.

16. An image sensor, comprising:
a pixel separation part in a substrate, the pixel separation part configured to separate first to fourth pixels;
side ground regions in the substrate adjacent to sidewalls of the pixel separation part in each of the first to fourth pixels and connected to each other to at least partially comprise a single side ground region extending continuously through the first to fourth pixels;
a lower ground region adjacent to a lower surface of the substrate in one of the first to fourth pixels;
a source follower gate electrode in another one of the first to fourth pixels; and
first to third impurity regions adjacent to the source follower gate electrode in the substrate, and spaced apart from each other,
wherein the lower ground region is in contact with at least a portion of the side ground regions, and
wherein the second impurity region and the third impurity region are electrically connected to each other.

17. An image sensor, comprising:
a substrate including a first pixel group and a second pixel group adjacent to each other in a first direction, wherein each given pixel group of the first and second pixel groups includes first to fourth pixels arranged in a clockwise direction around a center of the given pixel group;
a pixel separation part in the substrate, the pixel separation part configured to separate the first to fourth pixels of each pixel group from each other and to separate the first and second pixel groups from each other;
first to fourth transfer transistors in each given pixel group of the first and second pixel groups to correspond to separate, respective pixels of the first to fourth pixels in the given pixel group, wherein each of the first to fourth transfer transistors includes a transfer gate and a floating diffusion region; and
source follower transistors respectively located in at least one of the first to fourth pixels in each of the first and second pixel groups and connected to each other,
wherein each of the source follower transistors includes a source follower gate electrode and one source region and two drain regions adjacent to the source follower gate electrode,
wherein the one source region is adjacent to a center of the source follower gate electrode, and
wherein a first distance between the two drain regions is greater than a second distance between the one source region and one of the two drain regions.

18. The image sensor of claim 17, wherein the pixel separation part is absent at a center of each of the first and second pixel groups.

19. The image sensor of claim 17, further comprising:
in each given pixel group of the first and second pixel groups, side ground regions in the substrate adjacent to sidewalls of the pixel separation part in each of the first to fourth pixels of the given pixel group and connected to each other to at least partially comprise a single side ground region extending continuously through the first to fourth pixels of the given pixel group; and
a lower ground region adjacent to a lower surface of the substrate in one of the second to fourth pixels of the given pixel group,
wherein the lower ground region is in contact with some of the side ground regions of the given pixel group.

* * * * *